(12) United States Patent
Fukushima

(10) Patent No.: US 9,385,130 B2
(45) Date of Patent: Jul. 5, 2016

(54) SEMICONDUCTOR DEVICE AND METHOD FOR MANUFACTURING THE SAME

(75) Inventor: Yoichi Fukushima, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 654 days.

(21) Appl. No.: 13/357,764

(22) Filed: Jan. 25, 2012

(65) Prior Publication Data

US 2012/0193696 A1 Aug. 2, 2012

(30) Foreign Application Priority Data

Jan. 28, 2011 (JP) ................. 2011-016488

(51) Int. Cl.
*H01L 27/108* (2006.01)
*H01L 21/768* (2006.01)

(52) U.S. Cl.
CPC .... *H01L 27/10855* (2013.01); *H01L 21/76847* (2013.01); *H01L 21/76855* (2013.01); *H01L 27/10814* (2013.01); *H01L 27/10894* (2013.01)

(58) Field of Classification Search
CPC .............. H01L 27/10852; H01L 28/91; H01L 27/10894; H01L 27/10814; H01L 21/76897; H01L 27/10876; H01L 27/10855; H01L 27/10888
USPC ......... 257/296–313, 533, 595–602, 923–924, 257/E27.016–E27.017, E27.019–E27.021, 257/E27.023–E27.025, E27.03–E27.035, 257/E27.037–E27.038, E27.041–E27.045, 257/E27.047–E27.048, E27.071, E27.09, 257/E27.092–E27.093, E27.095, E27.101, 257/E27.114–E27.116; 438/171, 190, 210, 438/238–253, 329, 379, 387, 444, 901
See application file for complete search history.

(56) References Cited

U.S. PATENT DOCUMENTS

| | | | |
|---|---|---|---|
| 6,150,208 A * | 11/2000 | Deboer et al. ................ | 438/240 |
| 6,524,912 B1 | 2/2003 | Yang et al. | |
| 6,545,360 B1 | 4/2003 | Ohkubo et al. | |
| 7,053,462 B2 * | 5/2006 | Yang et al. ..................... | 257/534 |
| 7,071,056 B2 * | 7/2006 | Ping et al. ..................... | 438/255 |
| 7,642,572 B2 | 1/2010 | Popp et al. | |
| 2002/0008324 A1 * | 1/2002 | Shinkawata ................... | 257/774 |
| 2004/0004240 A1 * | 1/2004 | Nishikawa .................... | 257/303 |
| 2004/0058519 A1 | 3/2004 | Wu et al. | |
| 2004/0211999 A1 * | 10/2004 | Yamamoto et al. ........... | 257/296 |
| 2006/0170025 A1 | 8/2006 | Drynan | |
| 2006/0273388 A1 * | 12/2006 | Yamazaki ..................... | 257/330 |

FOREIGN PATENT DOCUMENTS

| | | |
|---|---|---|
| JP | 10242077 | 9/1998 |
| JP | 2001148472 | 5/2001 |
| JP | 2003017587 | 1/2003 |
| JP | 2003234416 | 8/2003 |
| JP | 2004508708 | 3/2004 |
| JP | 2004-179497 | 6/2004 |
| JP | 2008-251763 | 10/2008 |
| JP | 2008263201 | 10/2008 |
| JP | 2009-164534 | 7/2009 |

\* cited by examiner

*Primary Examiner* — David Vu
*Assistant Examiner* — Jonathan Han

(57) ABSTRACT

In order to achieve the reduction of contact resistance by forming a metal silicide layer with a sufficient thickness in an interface between a polycrystalline silicon plug and an upper conductive plug, the polycrystalline silicon plug contains germanium, which is ion-implanted before forming the metal silicide layer.

10 Claims, 28 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same. Specifically, the present invention relates to a plug having a hybrid structure, in which a polycrystalline silicon plug and a metal plug are combined, and a method for manufacturing the same.

2. Description of the Related Art

JP 2008-251763 A and JP 2004-179497 A disclose a contact plug for electrically connecting a source/drain diffusion layer of an MIS transistor formed on a semiconductor substrate and a lower electrode of a capacitor. Particularly, such contact plug has a two-contact stack structure, in which a side connected to a diffusion layer of a transistor is made of polycrystalline silicon (polysilicon) and a side connected to a lower electrode of a capacitor is made of a metal conductor, such as tungsten.

Also, JP 2009-164534 A discloses a triple-layered structure comprising two contact plugs that connect a polysilicon plug and a metal plug by interposing a metal silicide layer.

Generally, a contact between metal and silicon is a Schottky contact. Therefore, as disclosed in JP 2009-164534 A, an ohmic contact successfully can be achieved by interposing a metal silicide layer between metal and silicon. In order to form a metal silicide layer on a polysilicon plug, metal, such as titanium, cobalt and nickel, for forming a silicide with silicon are formed as film on the polysilicon plug and the films are heated by lamp annealing to be silicidated, and thereafter, unreacted metal films are removed. Such a series of processes is referred to as salicidation that means self-aligned silicidation.

In a semiconductor device, particularly, in a semiconductor memory device, such as DRAM, a capacitor is formed into a three-dimensional structure to maintain a predetermined capacitance by increasing its height with miniaturizing the device. Therefore, it is necessary to form structures other than a capacitor with low height so as to prevent the increase in the thickness of structures on a substrate. In addition, a distance between contacts narrows due to refinement and the thickness of an interlayer insulating film for forming contacts also becomes thinner (the height of contacts reduces). As mentioned above, although the silicidation requires heat treatment, as the contact height lowers, an adverse effect on semiconductor elements, such as transistor, formed on a semiconductor substrate becomes large. Therefore, it is difficult to form a metal silicide layer having a sufficient thickness because the heat treatment becomes insufficient.

SUMMARY

The present inventor has intensively investigated to form a metal silicide layer with a sufficient thickness during a short heating period for silicidation, he has found that it is possible to form a metal silicide layer with a sufficient thickness during a short period and to reduce contact resistance by introducing predetermined impurity to polycrystalline silicon prior to forming the metal silicide layer.

In other words, one embodiment of the present invention provides a semiconductor device, including: an insulating film overlaying a surface of a substrate; and a plug structure disposed in a hole formed in the insulating film, the plug structure comprising a first conductor including a polycrystalline silicon containing germanium, metal silicide formed on a surface of the first conductor and a second conductor contacting the metal silicide.

Another embodiment of the present invention provides a semiconductor device, including: an insulating film overlaying a surface of a substrate; and a plug structure disposed in a hole formed in the insulating film, the plug structure comprising a first conductor, metal silicide and a second conductor in order from a side close to the surface of the substrate, the first conductor containing germanium with a concentration higher than germanium contained in the second conductor.

According to at least one embodiment of the present invention, predetermined impurity is introduced into polycrystalline silicon prior to forming a metal silicide layer thereon, so that it is possible to form a metal silicide layer with a sufficient thickness during a short period and to reduce contact resistance.

Also, according to at least one embodiment of the present invention, one contact plug allows to have a hybrid structure having three layers of polycrystalline silicon, a metal silicide layer and a conductive film with lower height, thereby refining a semiconductor device.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Exemplary Embodiment 1

This exemplary embodiment explains an example of applying a contact plug of the invention to a semiconductor device comprising memory cells, such as a DRAM (Dynamic Random Access Memory). Particularly, this exemplary embodiment explains an example of using a trench gate type MISFET as a memory cell transistor and a contact plug having a hybrid structure according to the present invention as a storage-node contact connected to the memory cell transistor.

Figure 1:
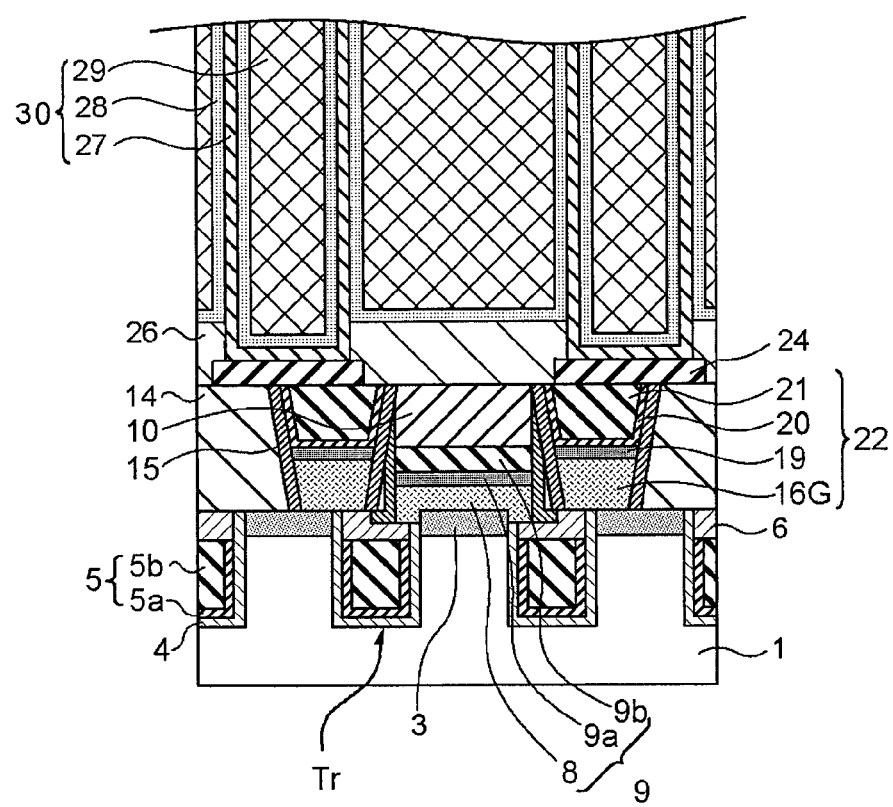
FIG. 1 is a schematic cross sectional view of a semiconductor device according to Exemplary Embodiment 1 of the present invention.

FIG. 1 is a schematic cross sectional view of a memory cell in a DRAM according to this exemplary embodiment. The cross section in FIG. 1 corresponds to the A-A cross section in the plane view in FIG. 2. In a silicon substrate as semiconductor substrate 1, gate electrode 5 as a trench gate type transistor is embedded, and as shown in the drawings, two transistors are formed to share a diffusion layer in the center. Bit line 9 is connected to the shared diffusion layer 3 (second electrode) and a contact plug having the hybrid structure in the present invention (hereinafter referred to as "hybrid plug 22") is connected to each of another diffusion layers 3 (first electrode) that are not shared by the two transistors. Lower electrode 27 of capacitor 30 is connected onto the hybrid plug 22 by interposing storage-node pad 24. The lower electrode 27 has a crown shape and the lower portion thereof is held by second interlayer insulating film 26. Dielectric film 28 and upper electrode 29 are formed on the lower electrode 27, and the lower electrode 27, the dielectric film 28, and the upper electrode 29 constitute the capacitor 30.

The hybrid plug 22 includes a polycrystalline silicon film (Ge-Poly-Si) 16G, into which germanium ion is introduced, cobalt silicide (CoSi) layer 19, barrier metal film 20, and tungsten (W) film 21 in order from the side of the diffusion layer 3 to be connected.

Next, a method for manufacturing the memory cell as shown in FIG. 1 is explained with reference to FIGS. 2 to 27. In a DRAM, other than a memory cell region, in which a memory cell is formed, a peripheral circuit region for controlling input and output of data in a memory cell is generally provided. Therefore, the method shows that some processes until forming a transistor and a contact in the peripheral circuit region are concurrently carried out.

Figure 2:
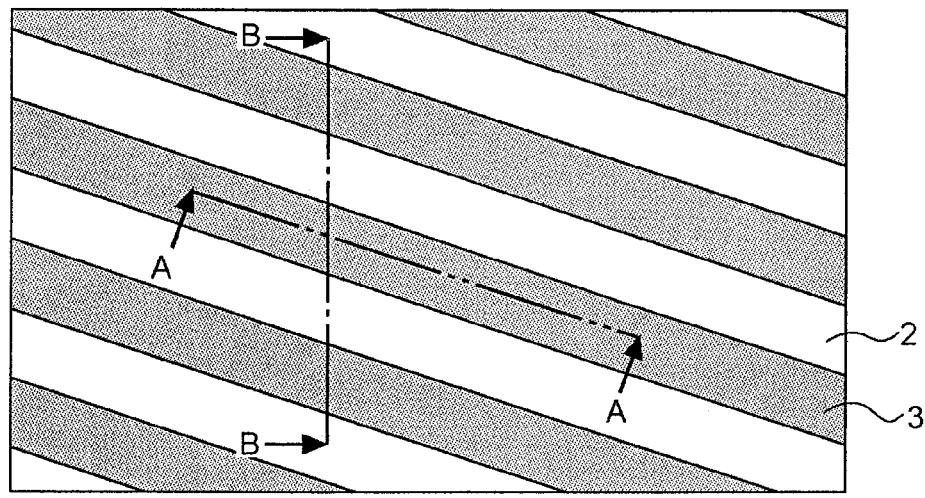
FIG. 2 is a plane view explaining a process for manufacturing a semiconductor device according to Exemplary Embodiment 1.

FIG. 2 is a plane view of a memory cell region, wherein shallow trench isolation (STI) film 2 and diffusion layer 3 are disposed in parallel to a predetermined direction (first direction) in silicon substrate 1.

First, a P-type silicon substrate is used as the semiconductor substrate 1 and an STI region comprising the STI film 2 is formed. For example, in the memory cell region, the width of the STI region is 50 nm and the width of an active region is 50 nm. Also, the STI film 2 has a depth of 300 nm. In the peripheral circuit region, STI film 2 is formed to have an optimal active region based on properties of a transistor to be formed.

Impurity is introduced into the surface of the memory cell region, so that diffusion layer 3, which is a source or drain region of a transistor, is formed. For example, phosphorous is used as the impurity and is introduced by ion-implantation at energy of 30 KeV and with a dose of $2 \times 10^{13}$ atoms/cm$^2$. Such dose and energy are adjusted so that the depth of the diffusion layer 3 is disposed at the same position similar as the upper face of a trench gate electrode when the diffusion layer is prepared. At this time, the peripheral circuit region is protected by a mask such as resist, and the diffusion layer 3 has not been formed at this stage.

Figure 3A:
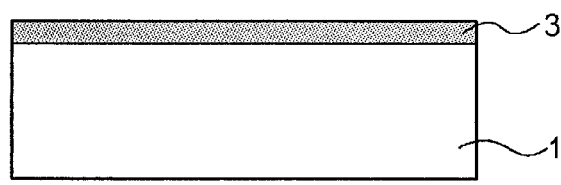
FIG. 3(a) shows the A-A cross section in FIG. 2.
Figure 3B:
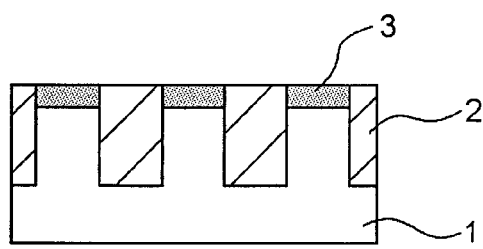
FIG. 3(b) shows the B-B cross section in FIG. 2.
Figure 3C:
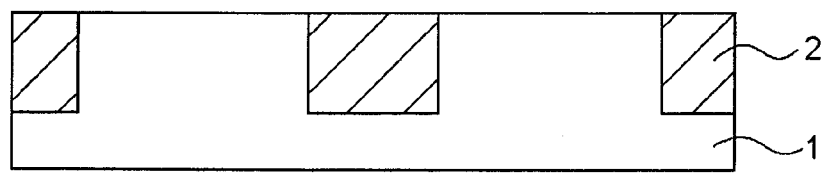
FIG. 3(c) is a cross sectional view of a peripheral circuit region.

FIGS. 3(*a*) to 3(*c*) show cross sectional views after the diffusion layer 3 is formed in the memory cell region. FIG. 3(*a*) shows the A-A cross section in FIG. 2, FIG. 3(*b*) shows the B-B cross section in FIG. 2, and FIG. 3(*c*) shows a peripheral circuit region. Unless otherwise described, the cross section views followed by FIG. 3 are prepared in the same manner.

Next, embedded gate electrode (trench gate) 5 extending to a second direction crossing the first direction is formed. On the semiconductor substrate, a silicon nitride film (not shown) is formed as a hard mask layer, and a resist pattern having a line and space pattern is formed in the memory cell region to pattern the hard mask layer. Also, the surface of the semiconductor substrate 1 is etched by using the hard mask as a mask to form a first groove. An active region, in which the diffusion layer 3 is formed, is etched to have a depth of 200 nm, and the STI region, in which the STI film 2 is formed, is etched to have a depth of 100 nm. The semiconductor substrate 1 exposed in the first groove is thermally oxidized, so that gate insulating film 4 is formed to have a thickness, for example, of 5 nm. Also, TiN barrier metal film 5*a* and W film 5*b* are formed in order as a gate electrode, and thereafter, trench gate 5 is formed by etching back them to around the bottom of the diffusion layer 3. A doped silicon film, refractory metal films other than tungsten film, and a laminate film thereof can be used as a gate electrode material. The gate electrode material is not limited to such films.

Figure 4:
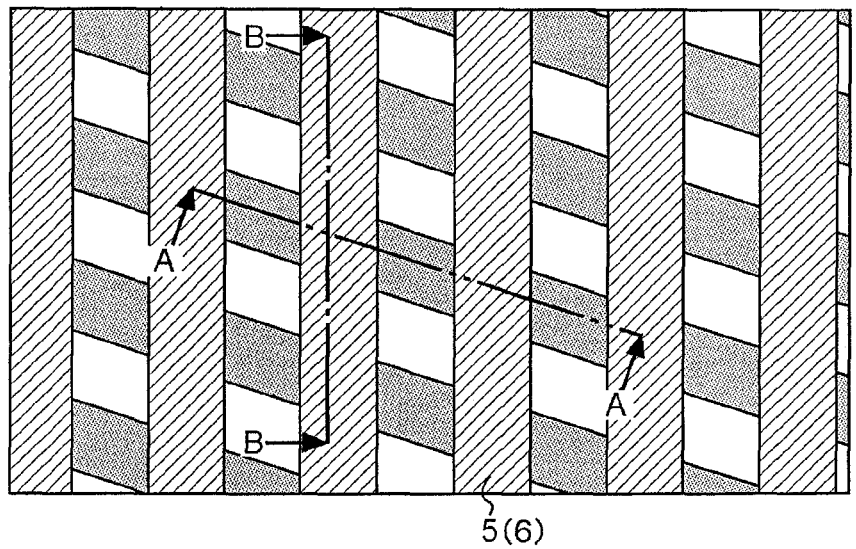
FIG. 4 is a plane view explaining a process followed by the process in FIG. 2.
Figure 5A:
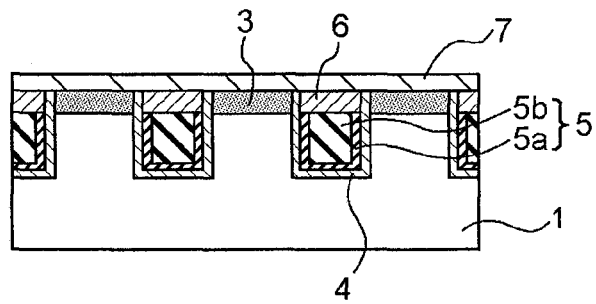
FIG. 5(a) shows the A-A cross section in FIG. 4.
Figure 5B:
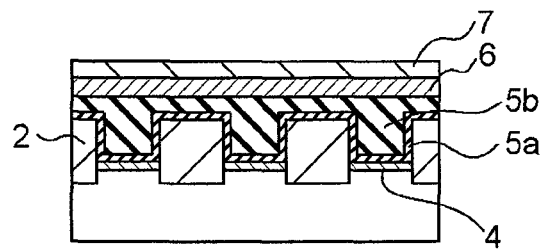
FIG. 5(b) shows the B-B cross section in FIG. 4.
Figure 5C:
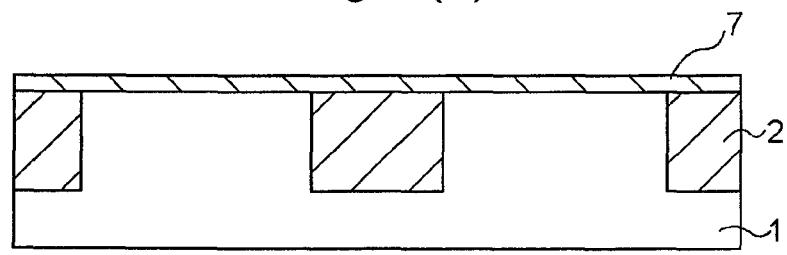
FIG. 5(c) is a cross sectional view of a peripheral circuit region.
Figure 6:
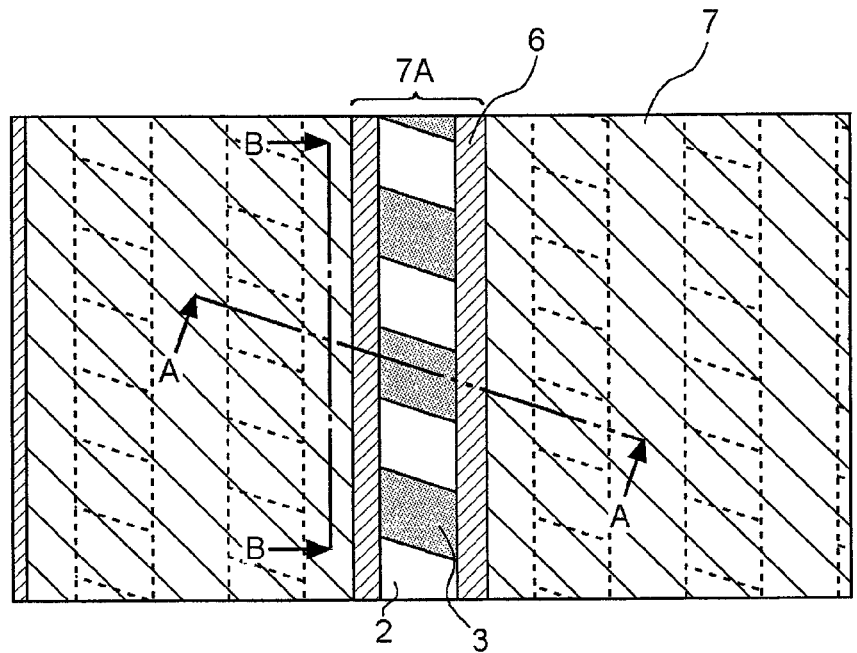
FIG. 6 is a plane view explaining a process followed by the process in FIG. 4.
Figure 7A:
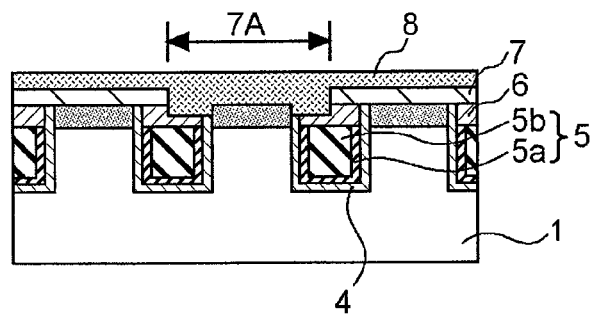
FIG. 7(a) corresponds to the A-A cross section in FIG. 6, FIG. 7(b) corresponds to the B-B cross section in FIG. 6.
Figure 7B:
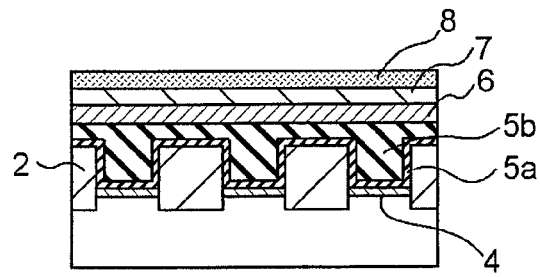
FIG. 7(c) is a cross sectional view of a peripheral circuit region.
Figure 7C:
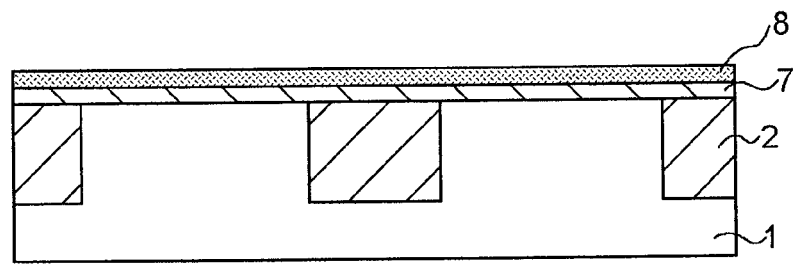
Figure 8A:
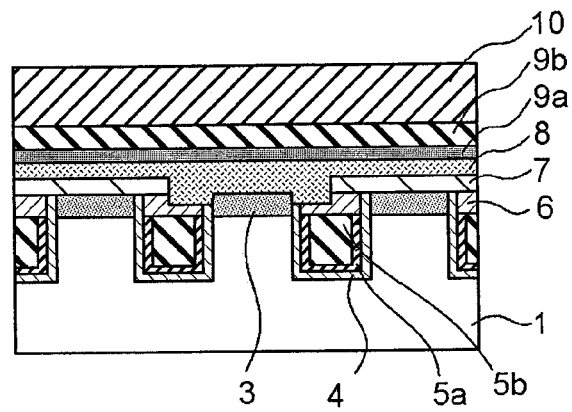
FIG. 8 explains a process followed by the process in FIG. 6, FIG. 8(a) corresponds to the A-A cross section in FIG. 6, FIG. 8(b) corresponds to the B-B cross section in FIG. 6.
FIG. 8(c) is a cross sectional view of a peripheral circuit region.
Figure 8B:
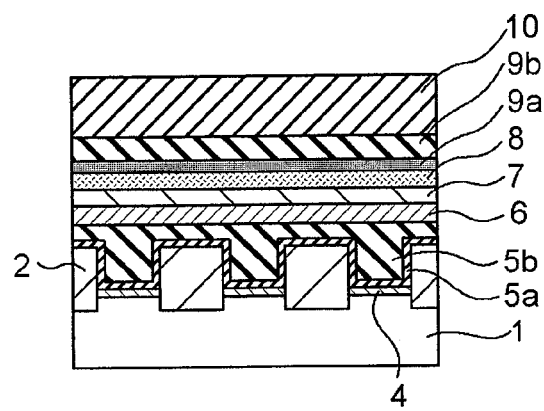
Figure 8C:
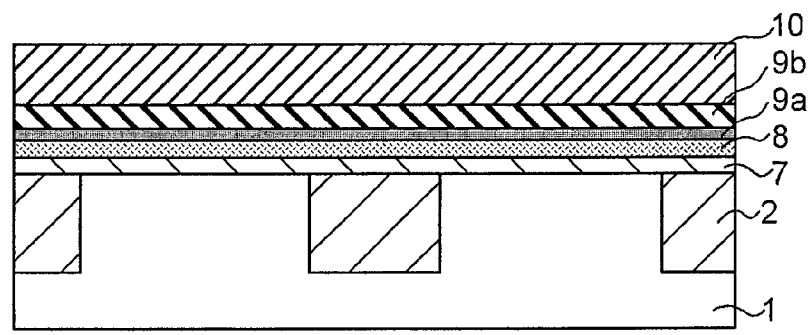

After etching back the trench gate, a liner nitride film is grown, and additionally, TEOS-BPSG film 6 is formed and annealed. After planarizing the surface by CMP, the silicon nitride film used as a hard mask is removed by dry or wet etching. In addition, a P-TEOS is grown as bit contact interlayer insulating film 7. FIGS. 4 and 5 show a state after forming the bit contact interlayer insulating film 7. FIG. 4 shows a state transmitting the bit contact interlayer insulating film 7. FIGS. 5(*a*) to 5(*c*) are cross sectional views.

Next, in order to form a bit contact, second groove 7A is formed in the bit contact interlayer insulating film 7. The second groove 7A is formed as a line pattern in the same direction (second direction) as the trench gate (word line) (see FIG. 6). At this time, the bit contact interlayer insulating film 7 is not removed in the peripheral circuit region. However, a thermal oxide film, which will be a gate insulating film, can be formed after removing the bit contact interlayer insulating film 7 in the peripheral circuit region. In addition, polycrystalline silicon doped with impurity (DOPOS 8) is formed to have a thickness of 40 nm on the bit contact interlayer insulating film 7 (see FIG. 7).

Figure 9:
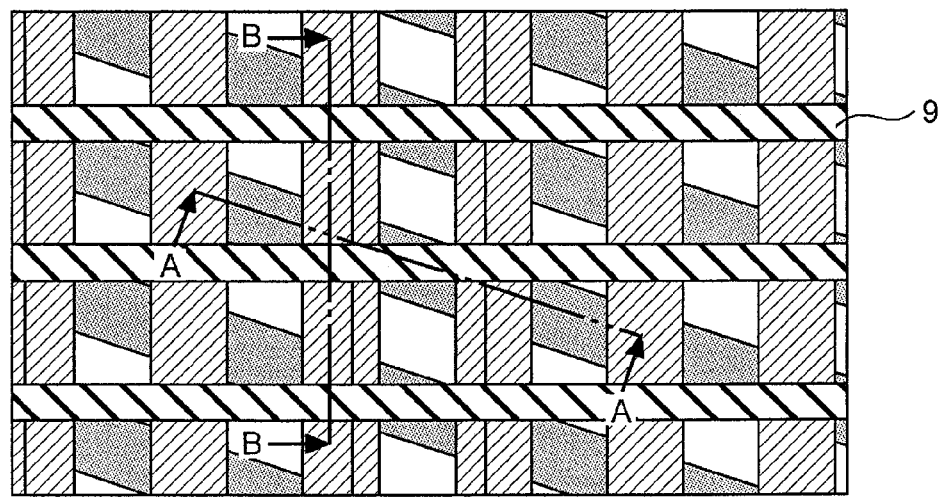
FIG. 9 is a plane view explaining a process followed by the process in FIG. 8.
Figure 10A:
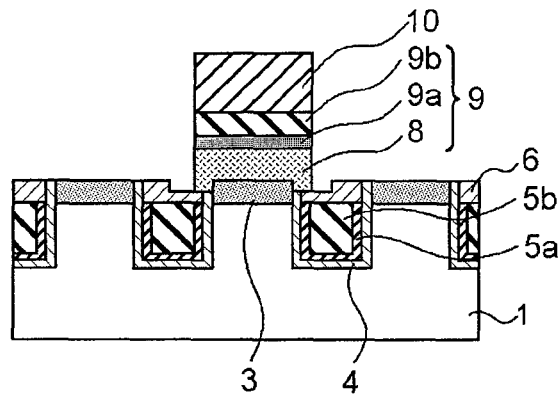
FIG. 10(a) shows the A-A cross section in FIG. 9.
Figure 10B:
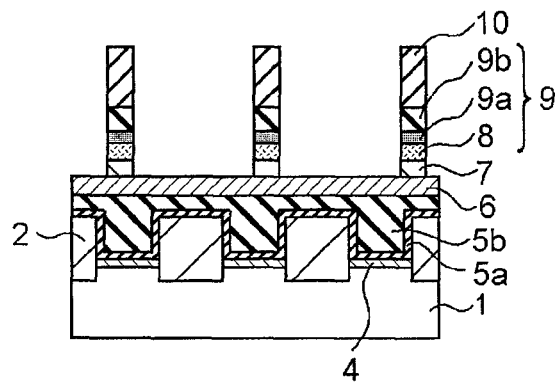
FIG. 10(b) shows the B-B cross section in FIG. 9.
Figure 10C:
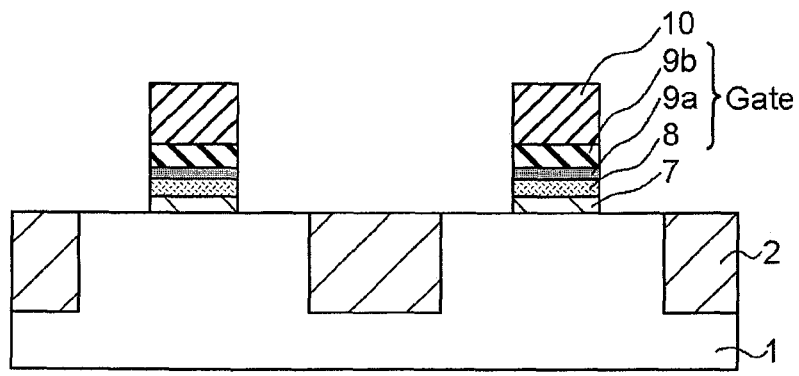
FIG. 10(c) is a cross sectional view of a peripheral circuit region.
Figure 11A:
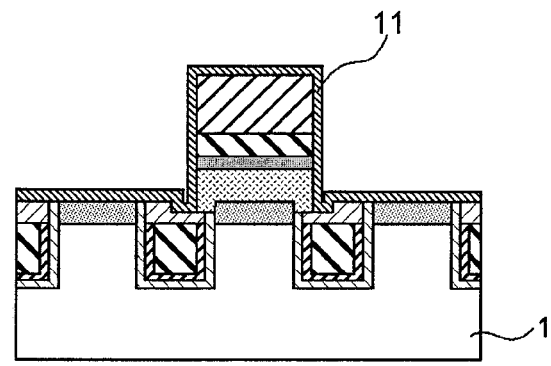
FIG. 11 explains a process followed by the process in FIG. 9, FIG. 11(a) corresponds to the A-A cross section in FIG. 9, FIG. 11(b) corresponds to the B-B cross section in FIG. 9.
FIG. 11(c) is a cross sectional view of a peripheral circuit region.
Figure 11B:
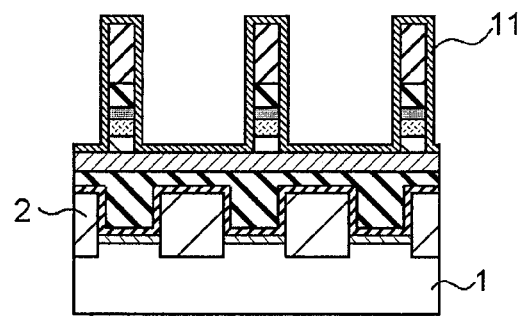
Figure 11C:
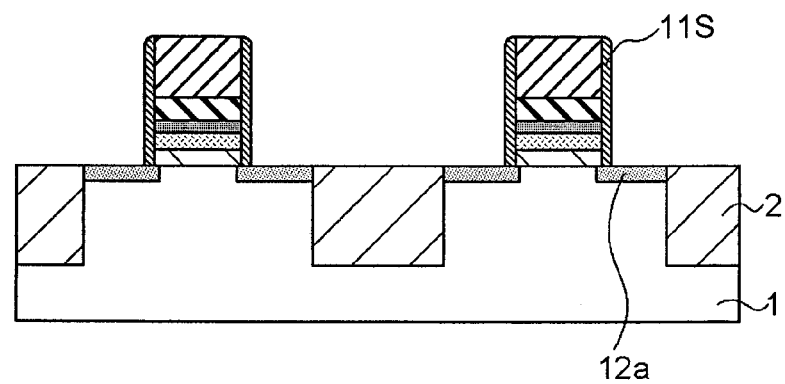

WSi film 9*a* with a thickness of 10 nm and W/WN film 9*b* with a thickness of 40 nm are formed on the DOPOS. In addition, mask nitride film 10 with a thickness of 150 nm is formed (see FIG. 8). Next, as shown in FIGS. 9 and 10, the mask nitride film 10 is patterned by conventional photolithography technology to form mask patterns for bit line 9 in the memory cell region and a gate electrode of a planar transistor in the peripheral circuit region. Thereafter, the W/WN film 9*b*, the WSi film 9*a*, the DOPOS 8, and the bit contact interlayer insulating film 7 are etched in order by using the mask nitride film 10 as a mask.

Next, nitride film 11, which will be an offset spacer of the peripheral circuit region, is formed in the entire surface, the memory cell region is masked by resist, etc., and only the peripheral circuit region is opened, so that the nitride film 11 is processed as offset spacer 11S. In addition, in order to form LDD layer 12*a* of a transistor in the peripheral circuit region, N-type impurity ion, such as phosphorous, is implanted.

P-type impurity, such as boron, can be ion-implanted into an N well preliminary formed in order to form a PMOS transistor in addition to an NMOS transistor in the peripheral circuit region.

Figure 12:
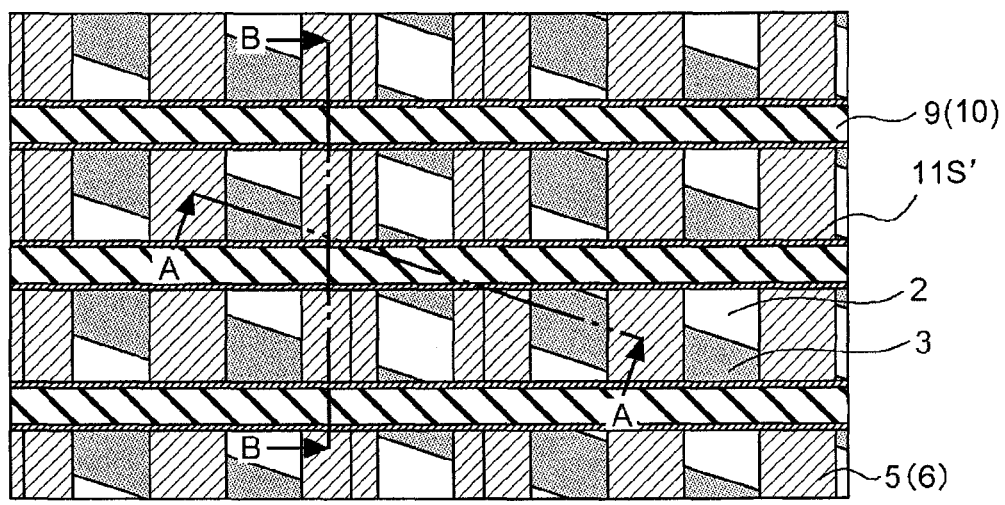
FIG. 12 is a plane view explaining a process followed by the process in FIG. 11.
Figure 13A:
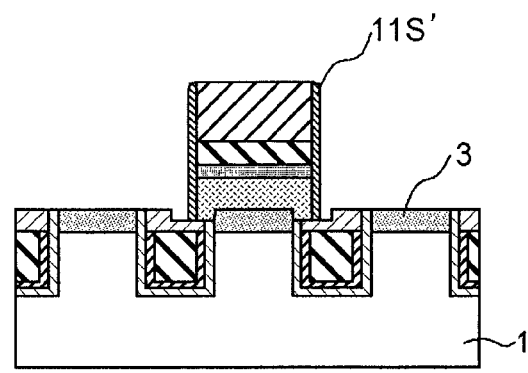
FIG. 13(a) shows the A-A cross section in FIG. 12.
Figure 13B:
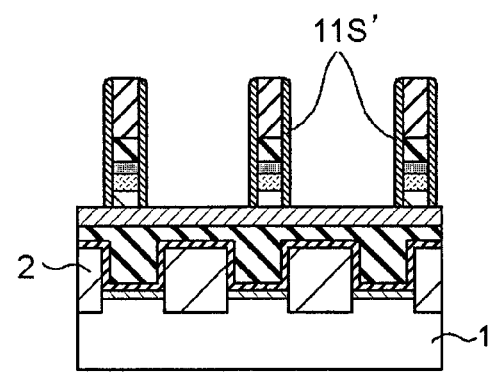
FIG. 13(b) shows the B-B cross section in FIG. 12.
Figure 13C:
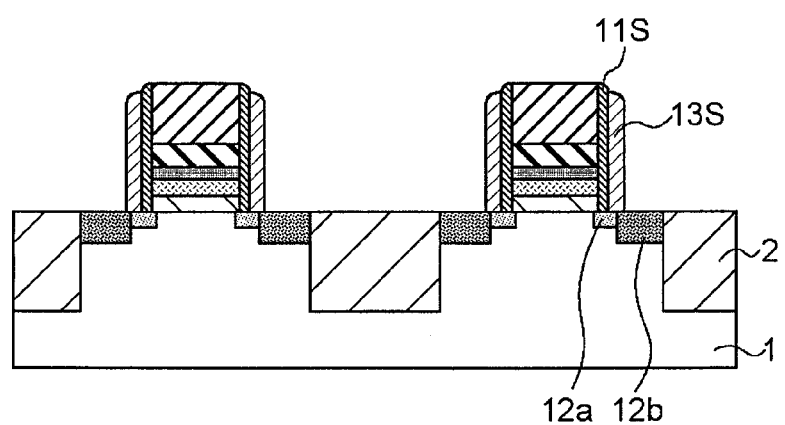
FIG. 13(c) is a cross sectional view of a peripheral circuit region.

Next, in order to form a high density diffusion layer (source and drain) 12*b* at a transistor in the peripheral circuit region, after forming sidewall 13S, N-type impurity is ion-implanted for NMOS transistors, or P-type impurity is ion-implanted for PMOS transistors. Thereafter, the nitride film 11 in the memory cell region is etched back, so that bit line sidewall 11S' is formed on the side of the bit line 9 (see FIG. 13). FIG. 12 is a plane view of the memory cell region after forming the bit line sidewall 11S'.

Figure 14A:
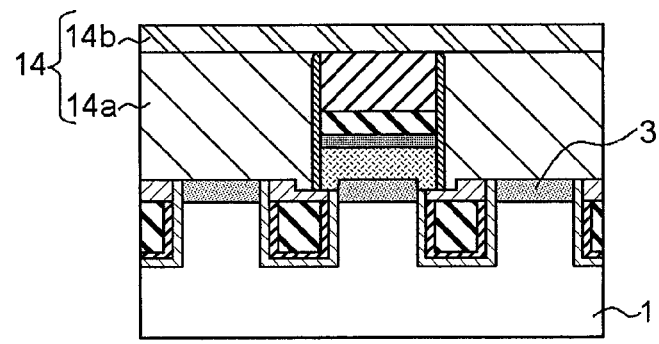
FIG. 14 explains a process followed by the process in FIG. 12, FIG. 14(a) corresponds to the A-A cross section in FIG. 12, FIG. 14(b) corresponds to the B-B cross section in FIG. 12.
FIG. 14(c) is a cross sectional view of a peripheral circuit region.
Figure 14B:
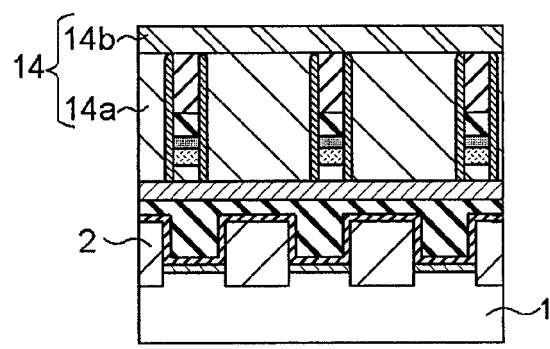
Figure 14C:
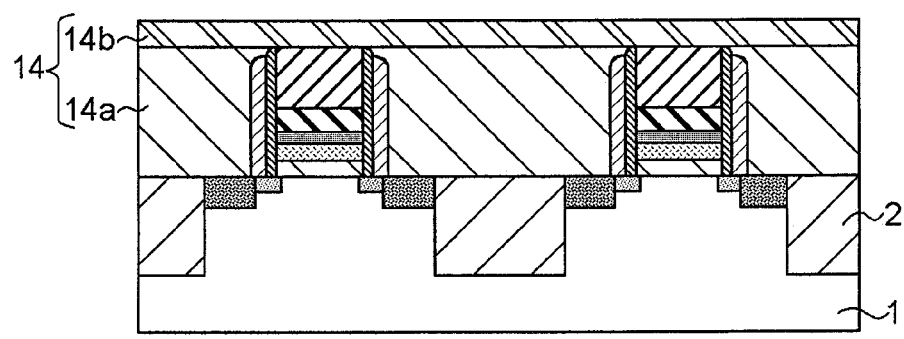

As shown in FIG. 14, a film, in which coatable insulating film (Spin On Dielectric: SOD film) 14*a* and plasma oxide film 14*b* are stacked, is formed as first interlayer insulating film 14 in the entire surface. The first interlayer insulating film 14 is formed by a method comprising forming a gate interlayer liner film (not shown), coating the SOD film 14*a*, lamp annealing, planarizing by CMP, and forming the plasma oxide film 14*b*.

Figure 15:
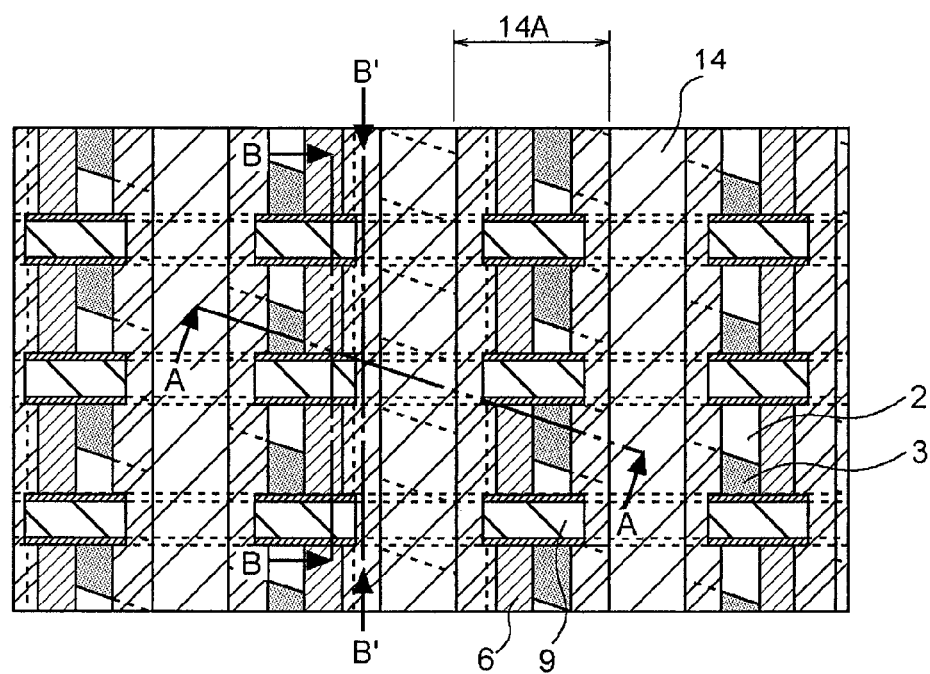
FIG. 15 is a plane view explaining a process followed by the process in FIG. 14.
Figure 16A:
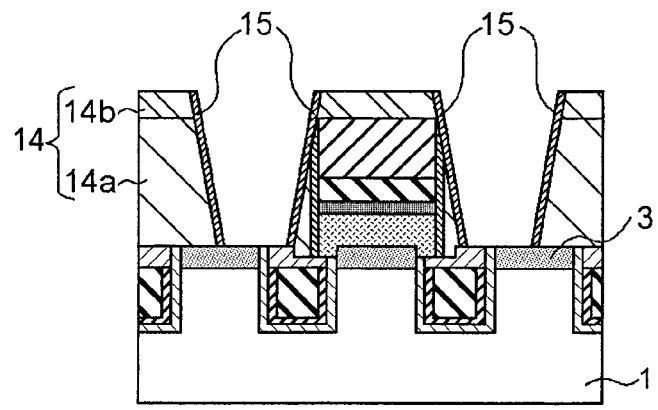
FIG. 16(a) shows the A-A cross section in FIG. 15, FIG. 16(b1) shows the B-B cross section in FIG. 15, and FIG. 16(b2) shows the B'-B' cross section in FIGS. 15, and 16(c) is a cross sectional view of a peripheral circuit region.
Figure 16:
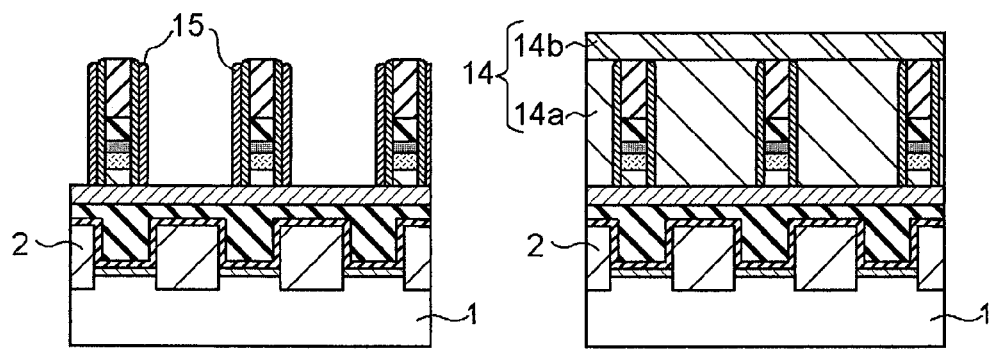
Figure 16C:
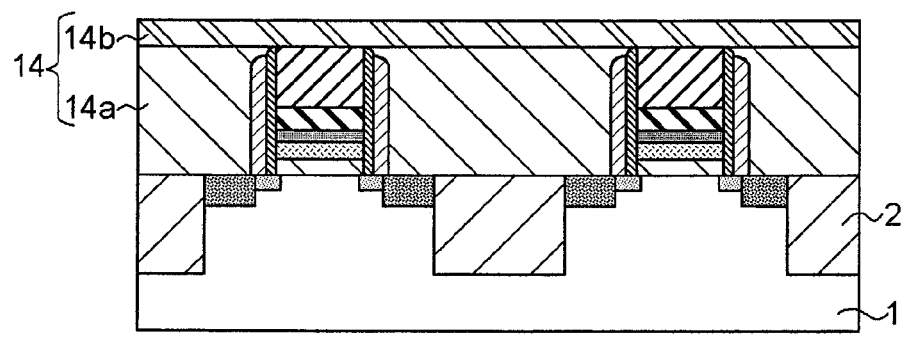

Next, in order to form a storage-node contact, the first interlayer insulating film 14 in the memory cell region is etched to have a line shape so as to form third groove 14A exposing the diffusion layer 3 on the surface of the semiconductor substrate. The bit line 9 is also exposed by the etching, so that a storage-node contact hole (hole) is defined by the sidewalls of the third groove 14A and the sidewalls which face of the adjacent bit lines 9 (sidewall 11S' of the bit line 9). FIG. 15 is a plane view after forming the third groove 14A, FIG. 16(*a*) is a cross section view by the A-A in FIG. 15, FIG. 16(*b*1) is a cross section view by the B-B in FIG. 15, FIG. 16(*b*2) is a cross sectional view by the B'-B' in FIGS. 15, and 16(*c*) is a cross sectional view of a peripheral circuit region. FIGS. 17 to 23, 25, and 27 are also prepared in the same manner.

Figure 17A:
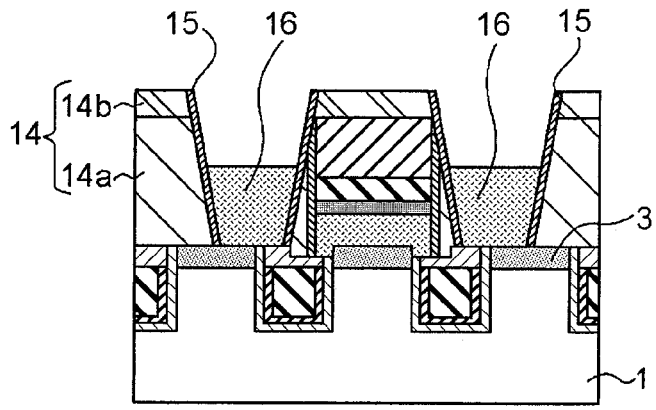
FIG. 17 explains a process followed by the process in FIG. 15, FIG. 17(a) corresponds to the A-A cross section in FIG. 15, FIG. 17(b1) corresponds to the B-B cross section in FIG. 15, FIG. 17(b2) corresponds to the B'-B' cross section in FIG. 15.
FIG. 17(c) is a cross sectional view of a peripheral circuit region.
Figure 17:
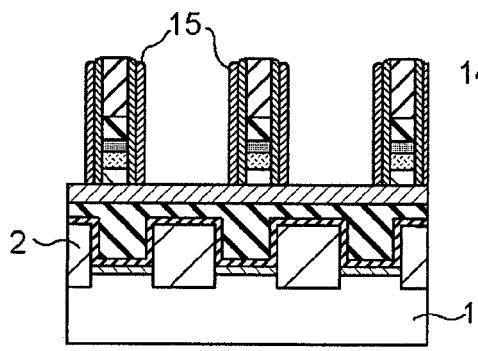
Figure 17:
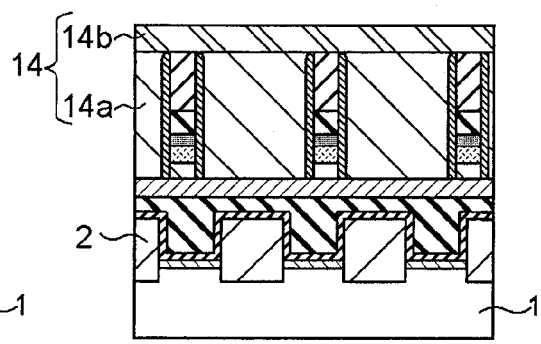
Figure 17C:
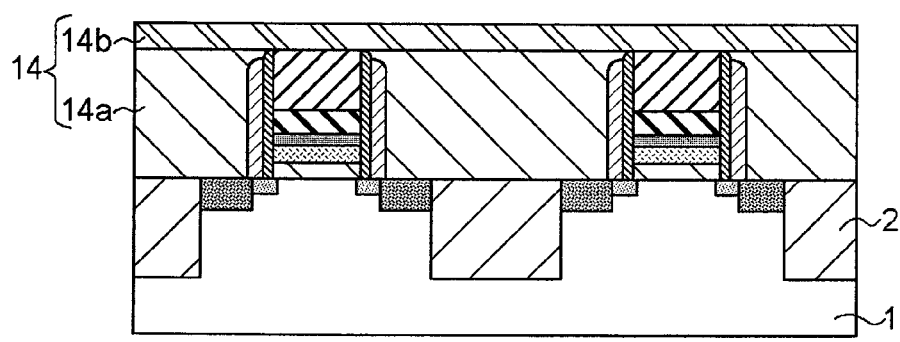

As shown in FIG. 17, storage-node contact sidewall 15 is formed on the side wall surfaces of the third groove 14A. At this time, the storage-node contact sidewall 15 is also formed on the side of the bit line 9 exposed in the groove.

Figure 18A:
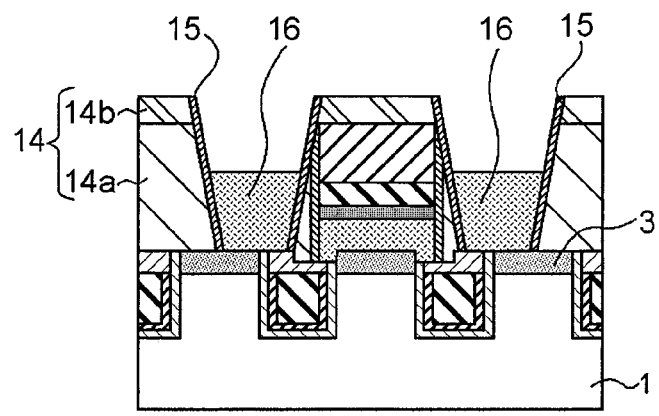
FIG. 18 explains a process followed by the process in FIG. 17, FIG. 18(a) corresponds to the A-A cross section in FIG. 15, FIG. 18(b1) corresponds to the B-B cross section in FIG. 15, FIG. 18(b2) corresponds to the B'-B' cross section in FIG. 15.
FIG. 18(c) is a cross sectional view of a peripheral circuit region.
Figure 18:
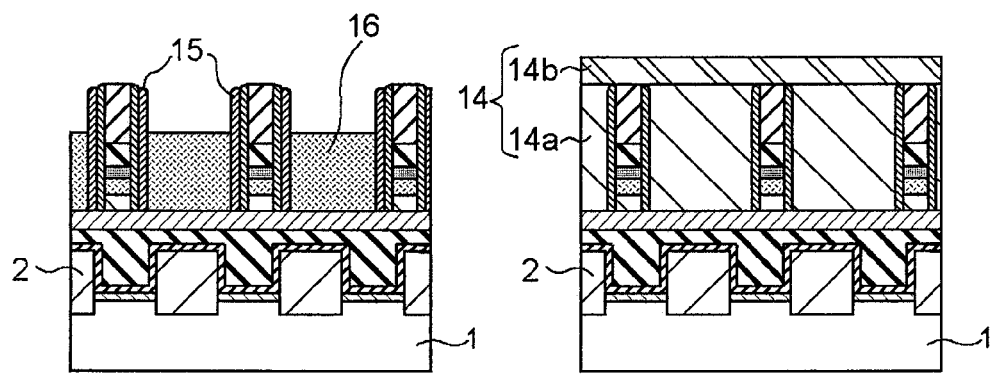
Figure 18C:
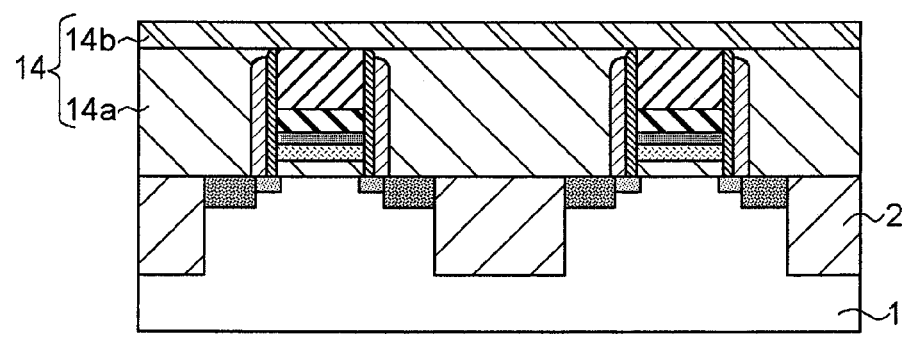
Figure 19A:
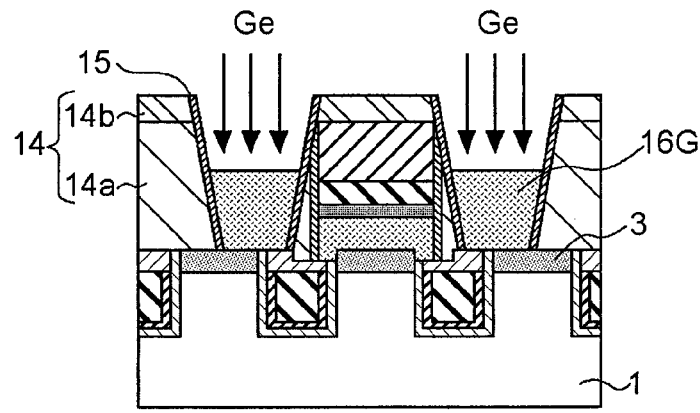
FIG. 19 explains a process followed by the process in FIG. 18, FIG. 19(a) corresponds to the A-A cross section in FIG. 15, FIG. 19(b1) corresponds to the B-B cross section in FIG. 15, FIG. 19(b2) corresponds to the B'-B' cross section in FIG. 15.
FIG. 19(c) is a cross sectional view of a peripheral circuit region.
Figure 19:
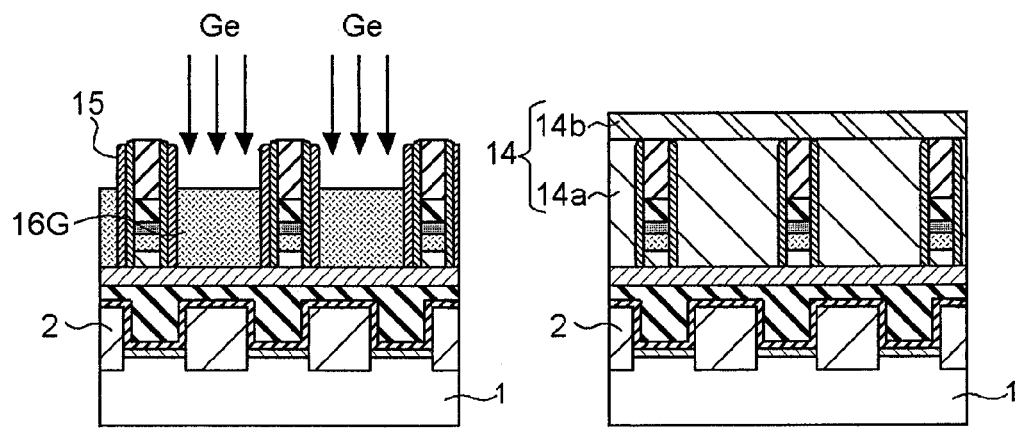
Figure 19C:
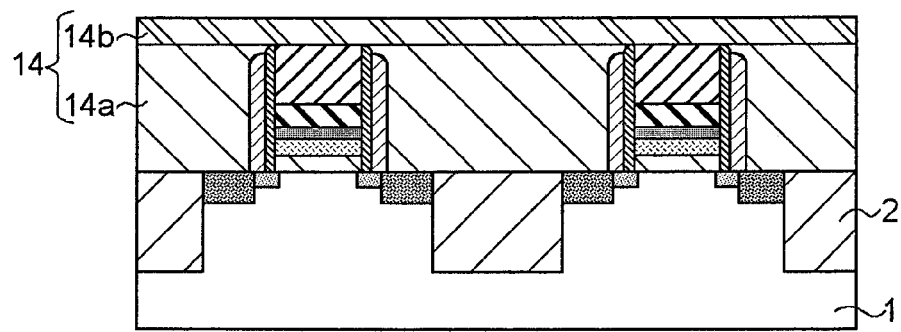

Next, after cleaning inside of the third groove 14A, DOPOS 16 for a storage-node contact is formed in the entire surface and subsequently, is etched back to have a thickness lower than the mask nitride film 10 on the bit line, for example, a thickness of 100 nm from the surface of the substrate (see FIG. 18). At this time, DOPOS adhered to the rear face of the substrate is removed. In addition, germanium is ion-implanted into the etched-back DOPOS 16, for example, at energy of 20 KeV and with a dose of $3 \times 10^{14}$ atoms/cm$^2$. As a result, Ge-Poly-Si 16G is prepared (FIG. 19). The dose of germanium is not limited to $3 \times 10^{14}$ atoms/cm$^2$ and the preferable does is $1\times10^{14}$ to $1\times10^{16}$ atoms/cm$^2$. After implanting germanium ion, lamp annealing is performed in nitrogen gas atmosphere at 700° C. for 10 seconds.

Figure 20A:
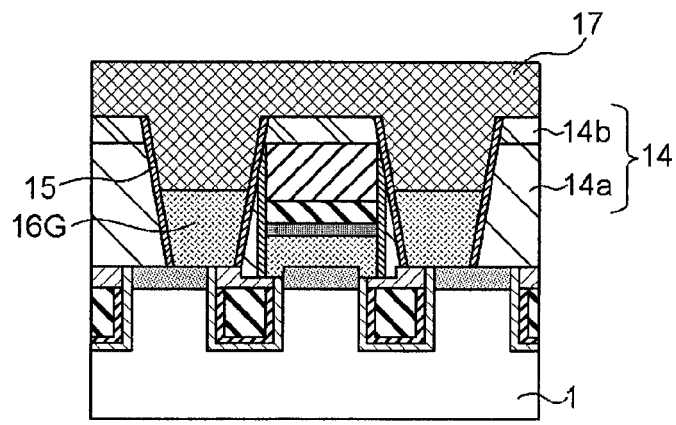
FIG. 20 explains a process followed by the process in FIG. 19, FIG. 20(a) corresponds to the A-A cross section in FIG. 15, FIG. 20(b1) corresponds to the B-B cross section in FIG. 15, FIG. 20(b2) corresponds to the B'-B' cross section in FIG. 15.
FIG. 20(c) is a cross sectional view of a peripheral circuit region.
Figure 20:
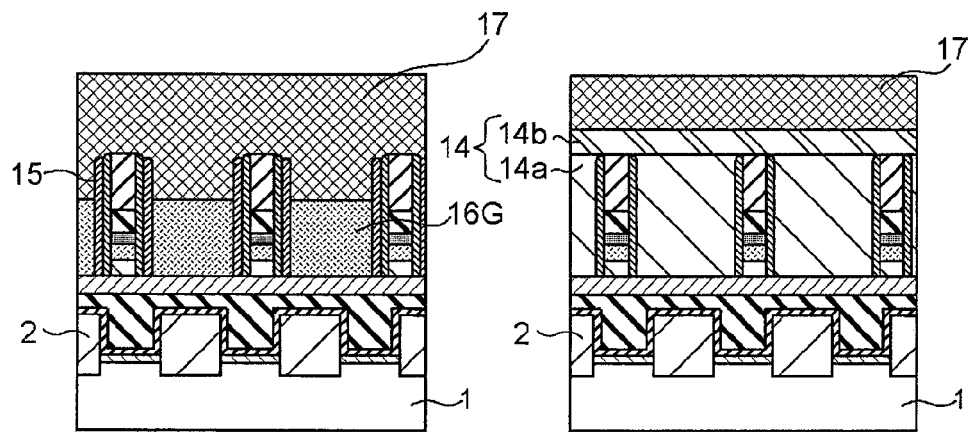
Figure 20C:
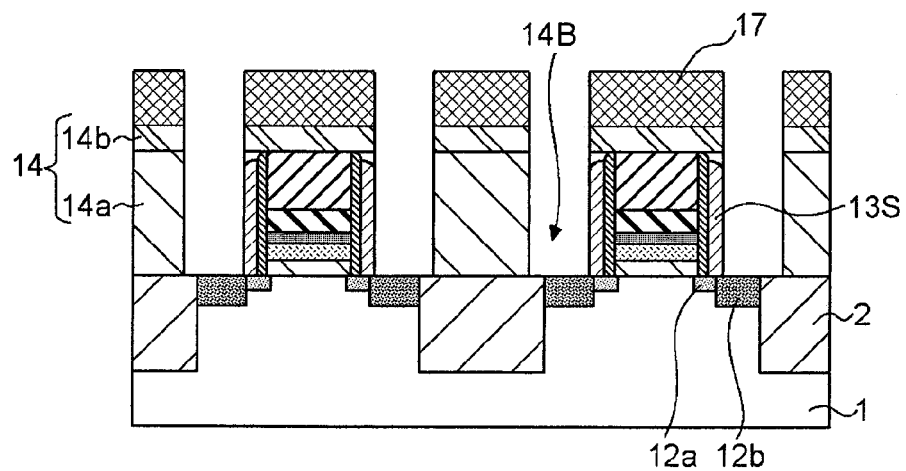
Figure 21A:
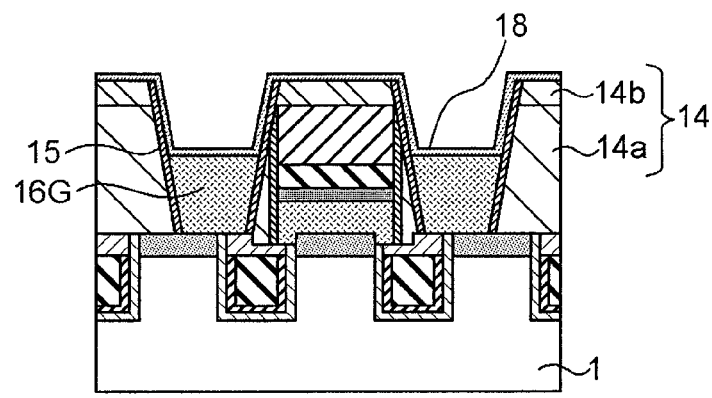
FIG. 21 explains a process followed by the process in FIG. 20, FIG. 21(a) corresponds to the A-A cross section in FIG. 15, FIG. 21(b1) corresponds to the B-B cross section in FIG. 15, FIG. 21(b2) corresponds to the B'-B' cross section in FIG. 15.
FIG. 21(c) is a cross sectional view of a peripheral circuit region.
Figure 21:
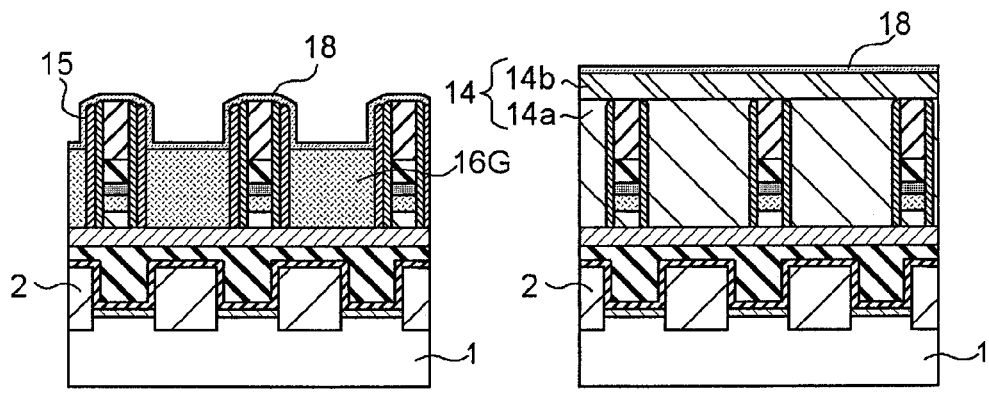
Figure 21C:
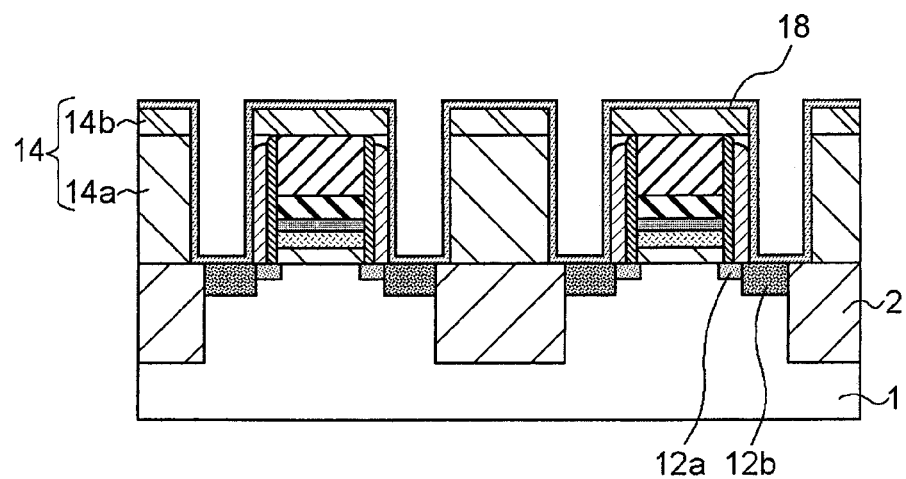

Next, in order to form a substrate contact in the peripheral circuit region, the entire surface is covered with mask layer 17 comprising a film, in which an amorphous carbon film and a photoresist are laminated, a contact hole pattern is formed in the peripheral circuit region, the first interlayer insulating film 14 is etched, and peripheral contact hole 14B is formed (see FIG. 20).

After removing the mask layer 17, cobalt film 18 is formed in the entire surface. At this time, after cleaning inside of the storage-node contact hole and inside of the peripheral contact hole 14B in the peripheral circuit region, cobalt (Co) film 18 is also formed inside the peripheral contact hole 14B (see FIG. 21).

Figure 22A:
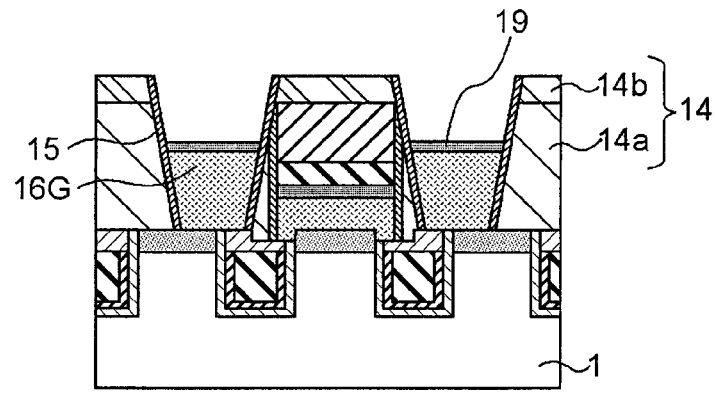
FIG. 22 explains a process followed by the process in FIG. 21, FIG. 22(a) corresponds to the A-A cross section in FIG. 15, FIG. 22(b1) corresponds to the B-B cross section in FIG. 15, FIG. 22(b2) corresponds to the B'-B' cross section in FIG. 15.
Figure 22:
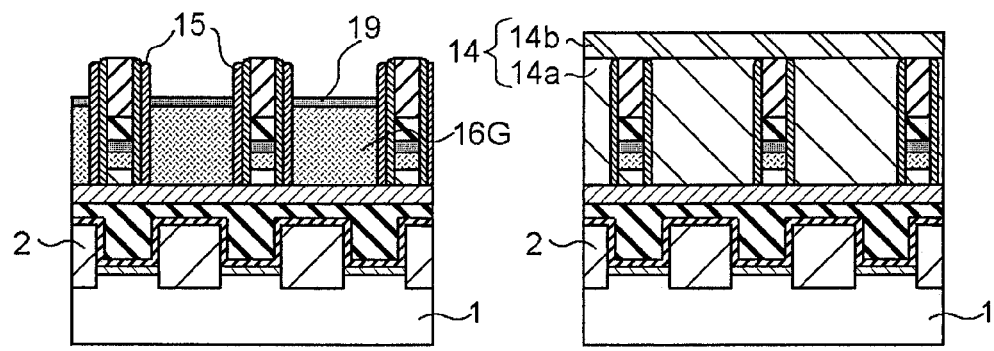
Figure 22C:
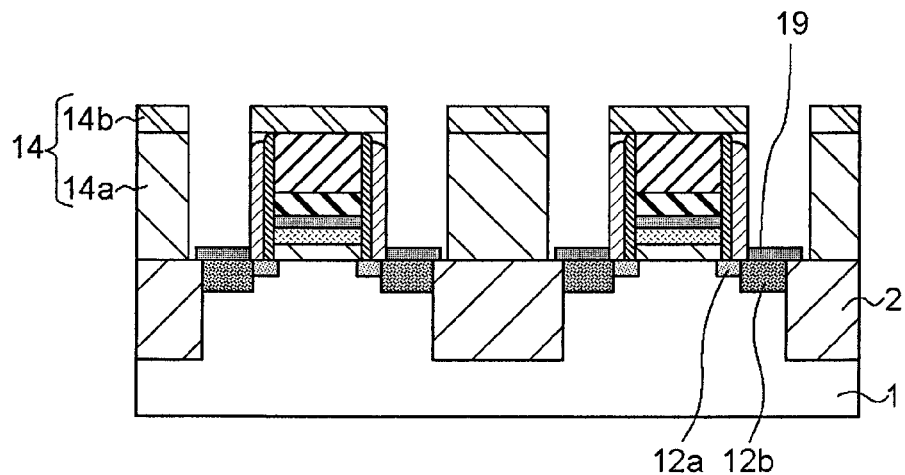
Figure 23A:
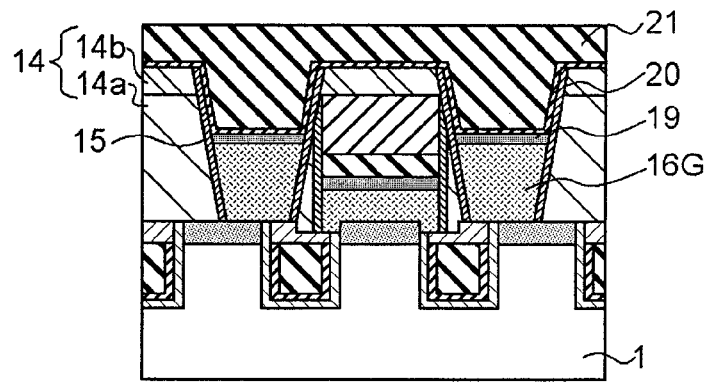
FIG. 23 explains a process followed by the process in FIG. 22, FIG. 23(a) corresponds to the A-A cross section in FIG. 15, FIG. 23(b1) corresponds to the B-B cross section in FIG. 15, FIG. 23(b2) corresponds to the B'-B' cross section in FIG. 15.
FIG. 23(c) is a cross sectional view of a peripheral circuit region.
Figure 23:
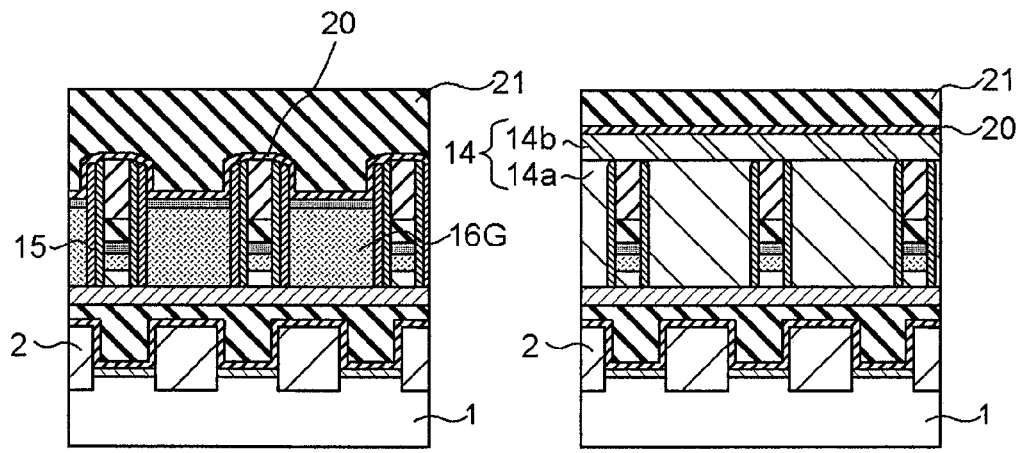
Figure 23C:
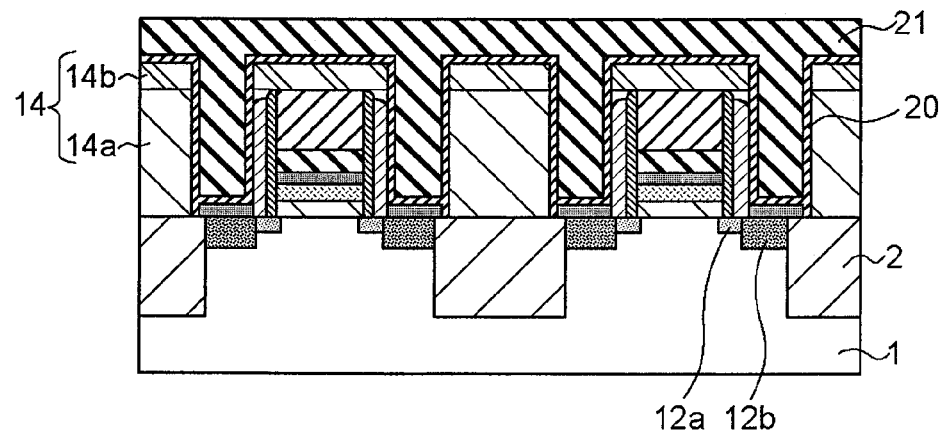
Figure 24:
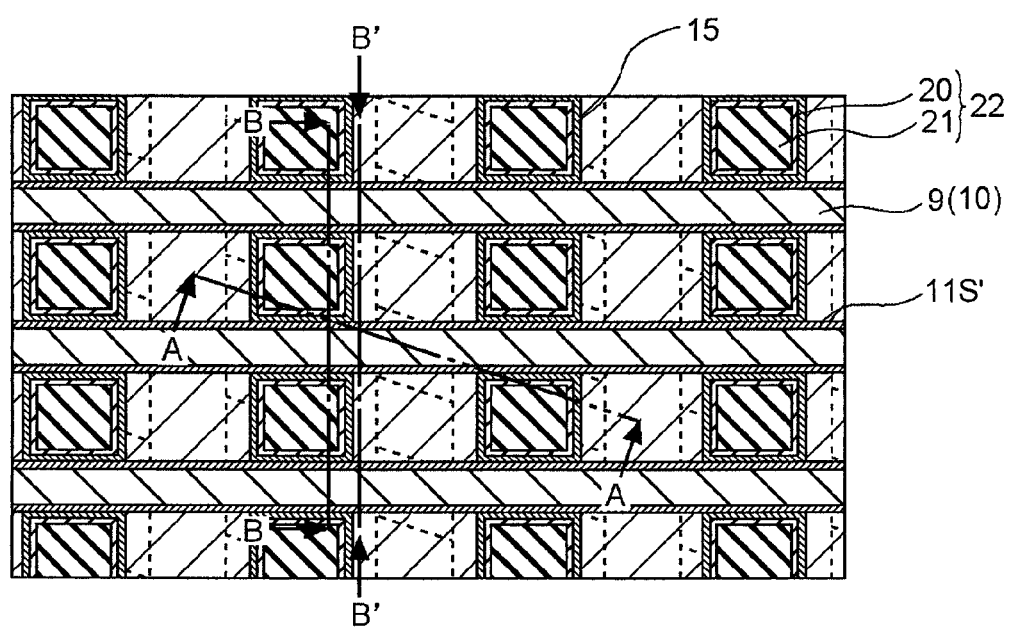
FIG. 24 is a plane view explaining a process followed by the process in FIG. 23.
Figure 25A:
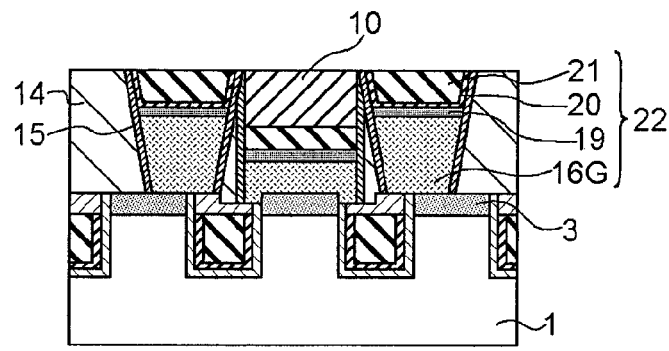
FIG. 25(a) shows the A-A cross section in FIG. 24, FIG. 25(b1) shows the B-B cross section in FIG. 24, and FIG. 25(b2) shows the B'-B' cross section in FIGS. 24, and 25(c) is a cross sectional view of a peripheral circuit region.
Figure 25:
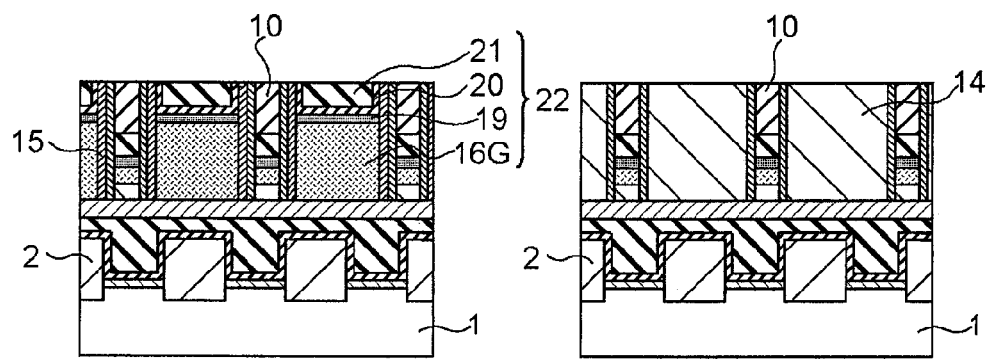
Figure 25C:
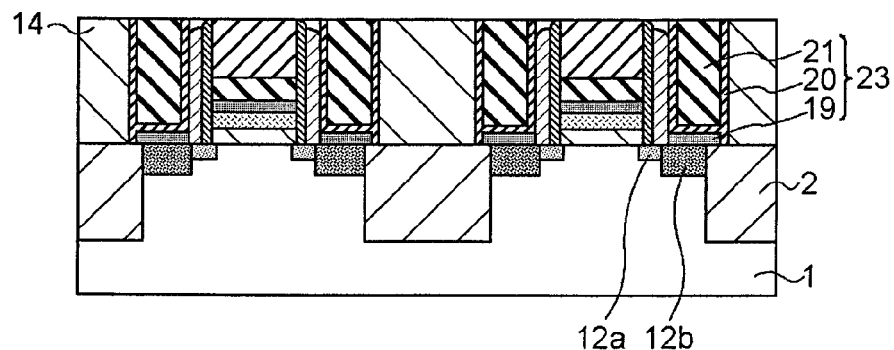

Lamp annealing is performed, so that cobalt silicide film 19 is formed through the reaction between the formed cobalt film 18 and silicon in the base. Lamp annealing is performed in nitrogen gas atmosphere at 650° C. for 30 seconds. FIG. 22 shows a state after removing unreacted cobalt film 18. In the memory cell region, cobalt silicide (CoSi) film 19 is formed on the Ge-Poly-Si 16G, and in the peripheral circuit region, the cobalt silicide film 19 is formed on the high density diffusion layer 12b. In this exemplary embodiment, the cobalt film 18 is formed to prepare the cobalt silicide film 19. However, the present invention is not limited to such method. The present invention can form another metal film (e.g., Ti, Ni, etc.), which can form silicide by reacting with silicon, so as to form the corresponding metal silicide film. If a substrate contact silicide film is concurrently formed in the peripheral circuit region, it is preferable to form cobalt silicide with less leakage current.

TiN/Ti barrier metal film 20 is formed as a conductive film in the entire surface, and tungsten (W) film 21 is sequentially formed. It is preferable to make the conductive film with a material having lower resistance than polycrystalline silicon. Particularly, it is preferable to use a metal conductor. Next, it is planarized by CMP using the mask nitride film 10 as an etching stopper, so that hybrid plug 22 is formed as a storage-node contact in the memory cell region and metal plug 23 is formed as a substrate contact in the peripheral circuit region (see FIGS. 24 and 25). By such process, the plasma oxide film formed as the first interlayer insulating film is entirely removed so that the first interlayer insulating film 14 corresponds to single-layer of the SOD film 14a.

Figure 26:
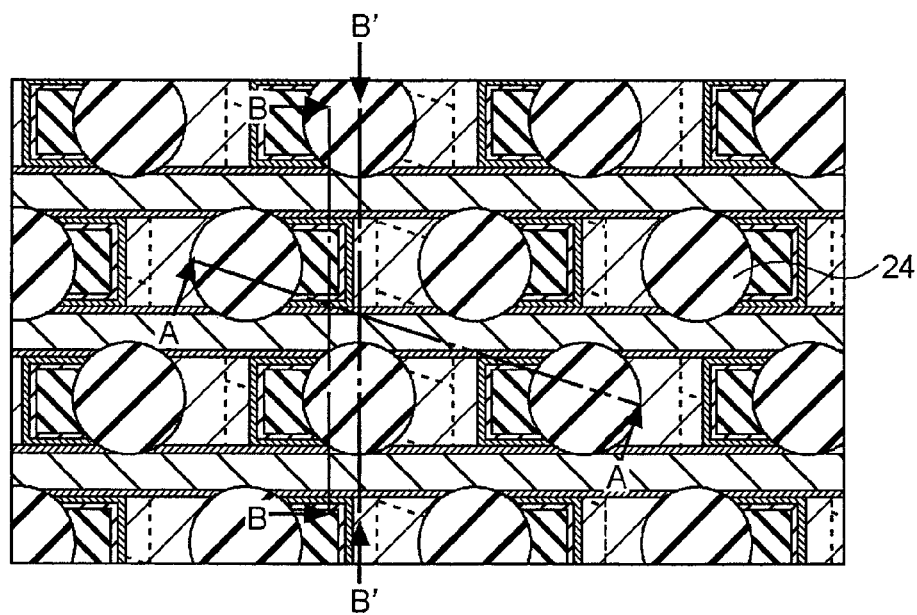
FIG. 26 is a plane view explaining a process followed by the process in FIG. 24.
Figure 27A:
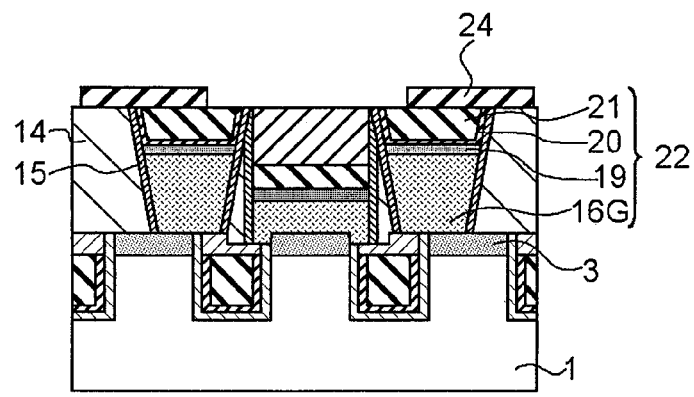
FIG. 27(a) shows the A-A cross section in FIG. 26, FIG. 27(b1) shows the B-B cross section in FIG. 26, and FIG. 27(b2) shows the B'-B' cross section in FIGS. 26, and 27(c) is a cross sectional view of a peripheral circuit region.
Figure 27:
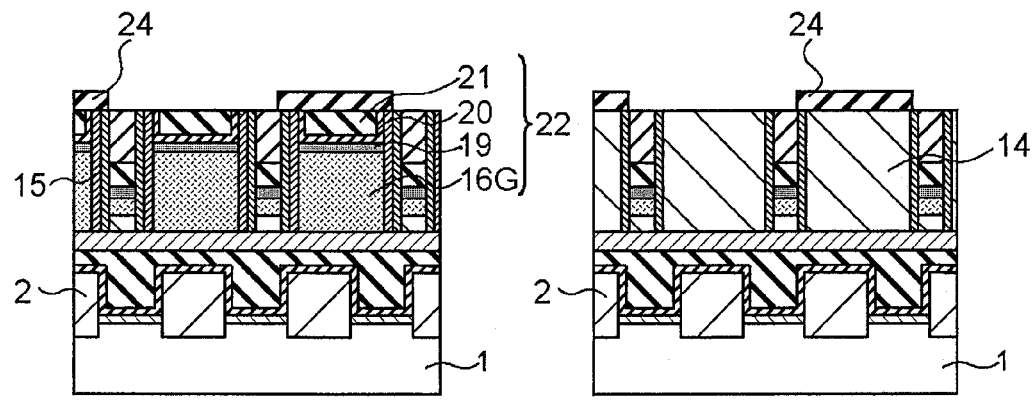
Figure 27C:
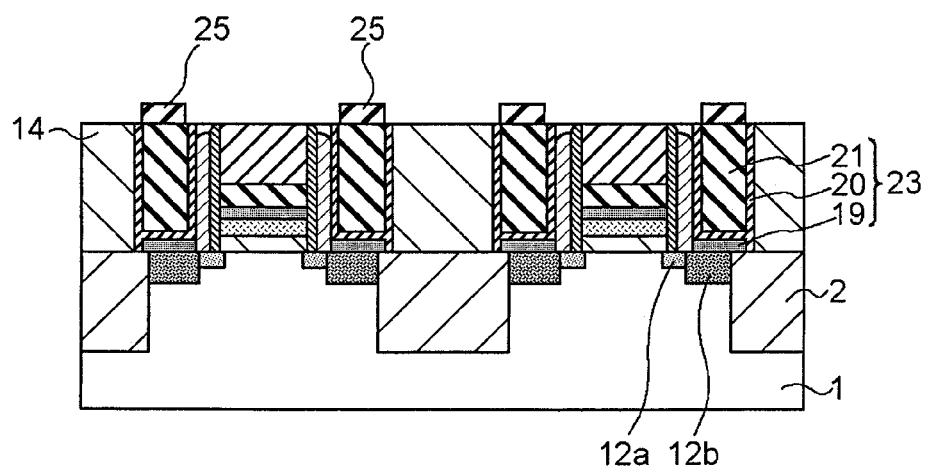

A W film with a thickness of 40 nm and a WN film with a thickness of 10 nm are formed in the entire surface by sputtering, and are patterned to storage-node pad 24 in the memory cell region and to wiring 25 in the peripheral circuit region (see FIGS. 26 and 27).

Thereafter, second interlayer insulating film 26 including a silicon nitride film, a third interlayer insulating film (not shown; a silicon oxide film that will be a template for forming a lower electrode in the memory cell region) of the peripheral circuit region are formed, lower electrode 27 of a capacitor is formed, the third interlayer insulating film in the memory cell region is removed to expose the outside walls of the lower electrode 27, and dielectric film 28 and upper electrode 29 are formed, thereby obtaining the memory cell shown in FIG. 1. In addition, an interlayer insulating film, an upper layer wiring, etc. (all not shown) are formed in an upper layer on the upper electrode, thereby obtaining the semiconductor device according to this exemplary embodiment.

When compared with a contact plug having a hybrid structure, in which a cobalt silicide film and a metal film are formed on a polysilicon film without implanting germanium ion, the contact plug according to this exemplary embodiment can reduce contact resistance by about 40%. Because a polysilicon film has less silicon transfer than single crystal silicon (silicon substrate), if silicide for a storage-node contact is formed concurrently with silicide for a substrate contact in the peripheral circuit region, a metal silicide film on a polysilicon film in the memory cell region becomes thin than the substrate contact silicide film in the peripheral circuit region. In the present invention, since impurity ions are implanted into a polysilicon film, Si—Si bond in the polysilicon film disconnects, and thereafter, the substantive thickness of a CoSi film becomes thick by performing Co sputtering and lamp annealing. Also, in the present invention, since germanium ions are implanted as an impurity, the resistance of NMOS reduces and the resistance of PMOS increases, thereby reducing resistance in a cell transistor of DRAM using NMOS. It is also possible to reduce the resistance of an NMOS transistor by applying the hybrid plug of the invention to a peripheral circuit region, as shown in the below described Exemplary Embodiment 2. Thus, the present invention can reduce resistance due to synergy effect of the bond disconnection of polysilicon by the ion implantation and the germanium ion implantation.

Exemplary Example 2

The above Exemplary Embodiment 1 explains the formation of a contact plug having a hybrid structure according to the present invention as a storage-node contact. However, the hybrid plug in the present invention is not limited to such a storage-node contact and can be formed as wiring contact 65 generally used in the art, as shown in FIG. 28.

Figure 28:
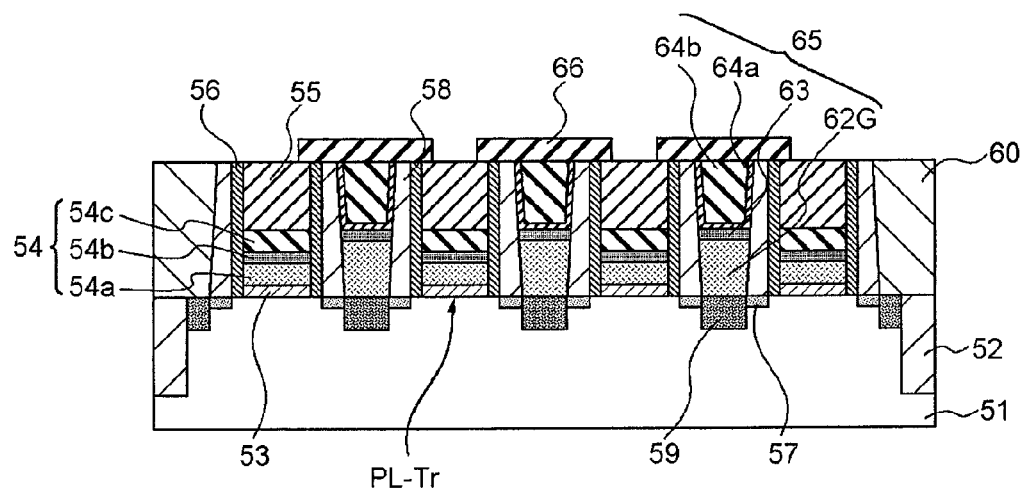
FIG. 28 is a schematic cross sectional view of a semiconductor device according to Embodiment 2 of the present invention.
Figure 29:
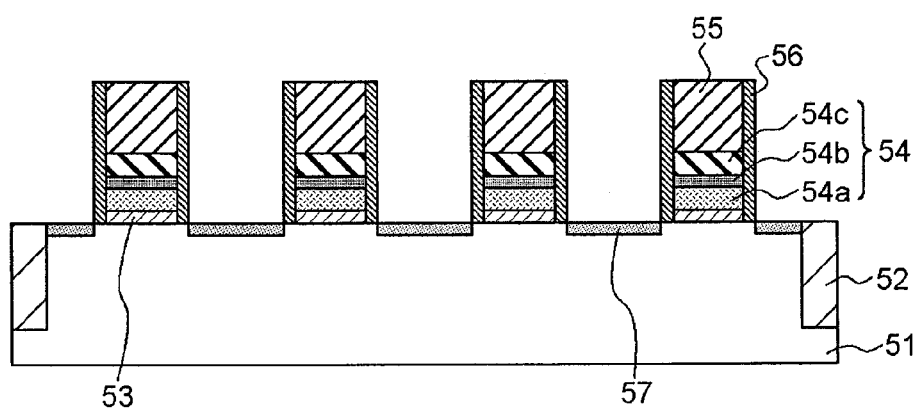
FIGS. 29 to 34 are schematic cross sectional views of a process for manufacturing a semiconductor device according to Embodiment 2 of the present invention.
Figure 30:
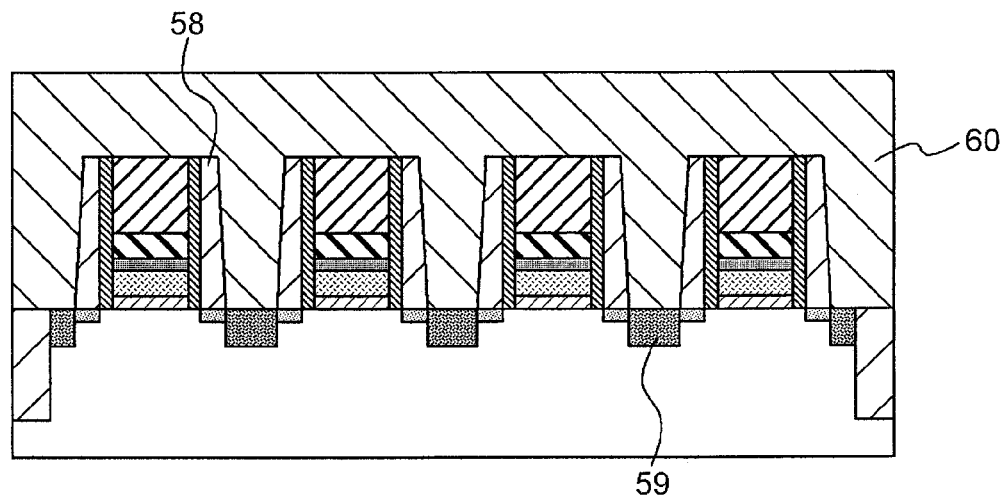

FIGS. 29 to 34 show a process for producing the structure shown in FIG. 28.

As in Exemplary Embodiment 1, gate electrode 54 of a planar transistor is formed in the peripheral circuit region. In semiconductor substrate 51, STI film 52 is formed, and a structure, in which gate insulating film 53, polysilicon film 54a, WN/WSi film 54b, W film 54c, and cap nitride film 55 are laminated, is formed as a laminate structure on an active region isolated by the STI film 52 and is patterned to have the same shape as the gate electrode. Thereafter, a silicon nitride film is formed as offset spacer 56 on the side of the gate electrode 54, and LDD layer 57 is formed in the active region, wherein a P-type silicon substrate is used as the semiconductor substrate 51 and N-type impurity is implanted into the LDD layer 57 (see FIG. 29).

Subsequently, sidewall 58 comprising a plasma oxide film is formed on the offset spacer 56, source/drain region 59 is formed, and first interlayer film 60 is formed by SOD, etc. (see FIG. 30).

Figure 31:
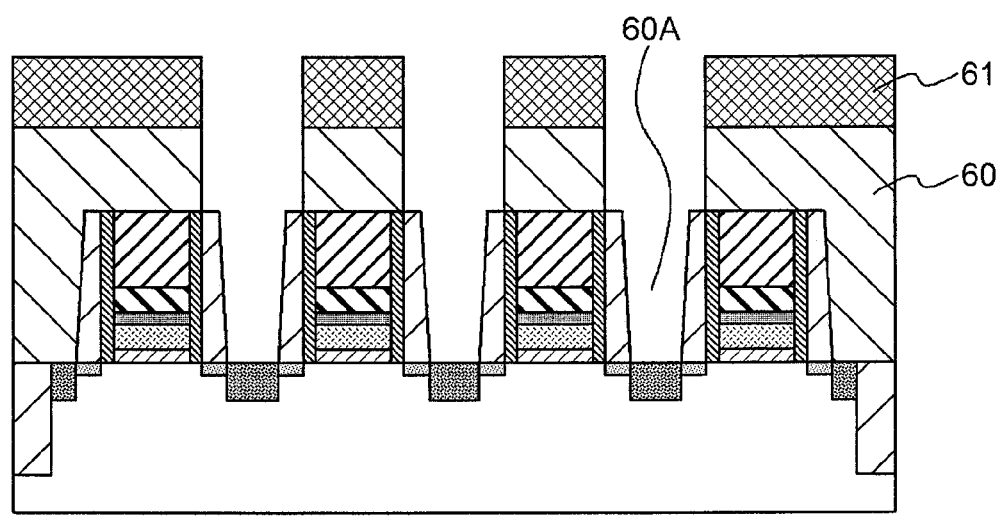
Figure 32:
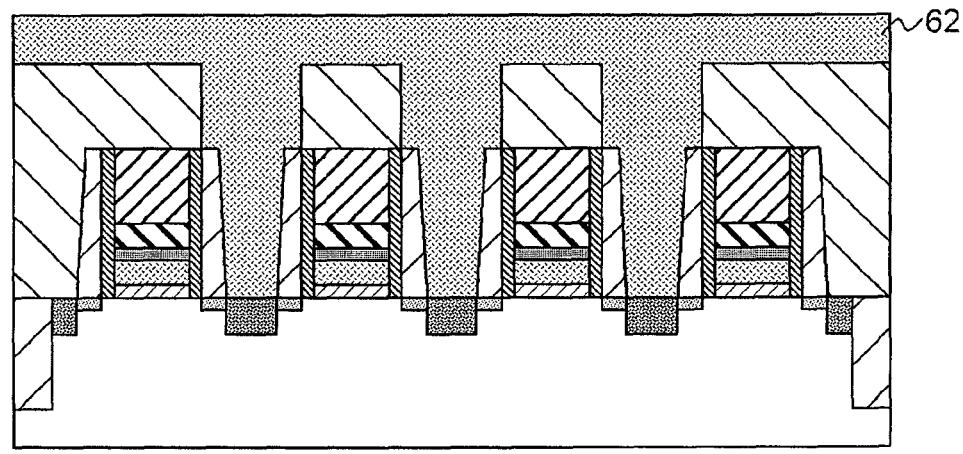

After forming photoresist mask 61 on the first interlayer insulating film 60, self-aligned contact hole 60A is formed using the sidewall 58 as a mask (see FIG. 31).

Figure 33:
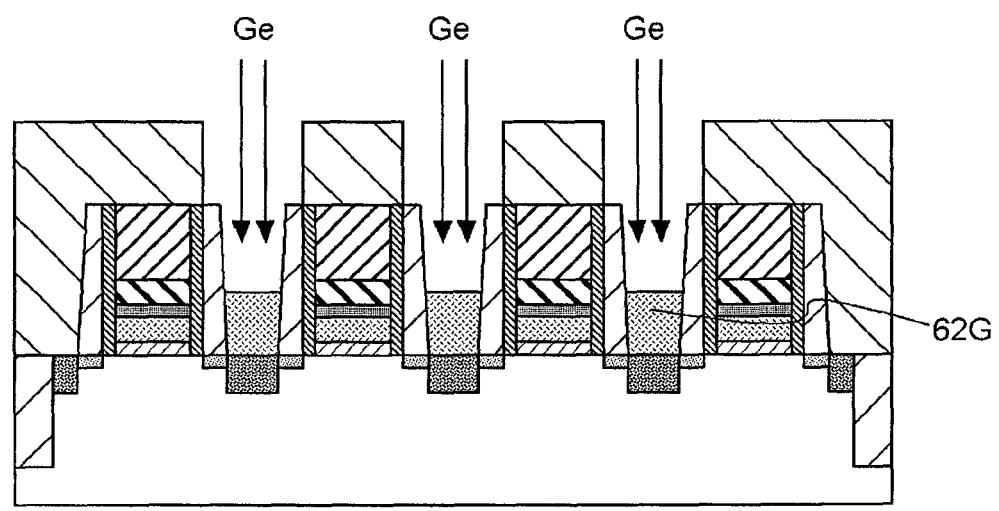

After forming DOPOS film 62 in the entire surface (see FIG. 32), as done in Exemplary Embodiment 1, the DOPOS film 62 is etched back and germanium ion is implanted into the DOPOS film 62 (see FIG. 33).

Figure 34:
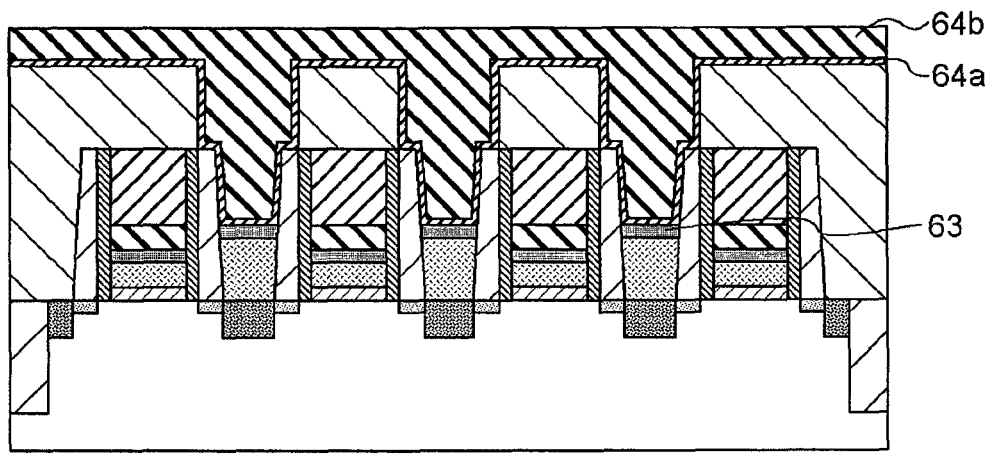

As done in Exemplary Embodiment 1, after forming cobalt silicide film 63 on Ge-doped DOPOS film 62G, TiN/Ti barrier metal film as barrier metal film 64a and tungsten film 64b are formed (see FIG. 34). Thereafter, the surface is planarized by CMP using the cap nitride film 55 as an etching stopper, and WN/W wiring 66 is subsequently formed, thereby obtaining the structure shown in FIG. 28. Also, as done in Exemplary Embodiment 1, a storage-node pad and a capacitor can be formed instead of the wiring 66.

Exemplary Embodiment 2 explains an example of forming a planar transistor, but it is possible to form a hybrid plug for a recess gate transistor, in which a part of a gate electrode is embedded in a semiconductor substrate, based on the same method.

Exemplary Embodiments 1 and 2 explain examples of forming a hybrid plug as a contact plug, in which a single-layered insulating film. However, the present invention is not limited to such plug. For example, as in JP 2009-164534 A that is described in the "Description of the Related Art" section above, the present invention can be applied to a plug that is connected by forming a metal silicide film on a polysilicon plug formed in a lower interlayer insulating film and by forming a metal plug in an upper interlayer insulating film, and the present invention can reduce resistance by implanting germanium ion to the polysilicon plug prior to forming a metal silicide film.

Also, the hybrid plug in the present invention can be connected to an upper electrode (upper diffusion layer) or a lower electrode (lower diffusion layer) as a contact plug of a vertical transistor. Also, the hybrid plug in the present invention can be used as a gate contact connected to a gate electrode of a vertical transistor.

What is claimed is:

1. A semiconductor device, comprising:
   an insulating film overlaying a surface of a substrate; and
   a plug structure disposed in a hole formed in the insulating film, the plug structure comprising
     a first conductor including a polycrystalline silicon containing germanium,
     metal silicide formed on a surface of the first conductor, and
     a second conductor contacting the metal silicide,
     wherein the second conductor comprises a barrier metal film and a metal plug, the barrier metal film contacting a bottom surface and opposing side surfaces of the metal plug.

2. The semiconductor device according to claim 1, wherein the first conductor is implanted with germanium ion with a dose of $1\times10^{14}$ to $1\times10^{16}$ atoms/cm$^2$.

3. The semiconductor device according to claim 1, wherein the metal plug is a tungsten plug.

4. The semiconductor device according to claim 3, further comprising:
   a capacitor connected to the plug structure.

5. The semiconductor device according to claim 1, wherein the plug structure is connected to one electrode of a semiconductor element formed on the substrate.

6. The semiconductor device according to claim 5, wherein the semiconductor element is an embedded gate type transistor in which a gate electrode is embedded into a semiconductor substrate, and the plug structure is connected to a diffusion layer formed on the surface of the semiconductor substrate as an electrode of the transistor.

7. The semiconductor device according to claim 6, further comprising:
   a bit line connected to another diffusion layer, which is different from the diffusion layer connected to the plug structure, on the semiconductor substrate,
   wherein the upper surface of the plug structure is formed on the same face as the upper surface of an insulating film on the bit line provided into the insulating film.

8. The semiconductor device according to claim 5, wherein the semiconductor element is a transistor having a structure that at least a part of a gate electrode is projected onto a semiconductor substrate, and the plug structure is connected to a diffusion layer formed on the surface of the semiconductor substrate as an electrode of the transistor.

9. A semiconductor device, comprising:
   an insulating film overlaying a surface of a substrate; and
   a plug structure disposed in a hole formed in the insulating film, the plug structure comprising
     a first conductor, metal silicide, and a second conductor, in order, from a side close to the surface of the substrate,
     the first conductor containing germanium, and
     the second conductor comprising a barrier metal film and a metal plug, the barrier metal film contacting a bottom surface and opposing side surfaces of the metal plug.

10. The semiconductor device according to claim 9, wherein the first conductor is implanted with germanium ion with a dose of $1\times10^{14}$ to $1\times10^{16}$ atoms/cm$^2$.

* * * * *